(12) United States Patent
Tochi et al.

(10) Patent No.: US 7,714,486 B2
(45) Date of Patent: May 11, 2010

(54) ANGULAR VELOCITY SENSOR AND ANGULAR VELOCITY SENSING DEVICE

(75) Inventors: Kenichi Tochi, Tokyo (JP); Tatsuo Namikawa, Tokyo (JP); Ken Unno, Tokyo (JP); Takao Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 247 days.

(21) Appl. No.: 12/078,050

(22) Filed: Mar. 26, 2008

(65) Prior Publication Data

US 2009/0039739 A1 Feb. 12, 2009

(30) Foreign Application Priority Data

Mar. 30, 2007 (JP) ............................. 2007-091269

(51) Int. Cl.
*H01L 41/08* (2006.01)
(52) U.S. Cl. ....................................... 310/370; 310/348
(58) Field of Classification Search .................. 310/348, 310/370
See application file for complete search history.

(56) References Cited

U.S. PATENT DOCUMENTS 4,468,584 A * 8/1984 Nakamura et al. .......... 310/370

FOREIGN PATENT DOCUMENTS

| JP | A 8-128833 | 5/1996 |
| JP | A 2003-227719 | 8/2003 |
| JP | 2004-333460 | * 11/2004 |
| JP | A 2004-333460 | 11/2004 |
| JP | A 2005-106481 | 4/2005 |
| JP | B2 3694160 | 9/2005 |

* cited by examiner

*Primary Examiner*—Thomas M Dougherty
(74) *Attorney, Agent, or Firm*—Oliff & Berridge, PLC

(57) ABSTRACT

The present invention provides an angular velocity sensor in which higher sensitivity for sensors is available even with a smaller base portion. The angular velocity sensor includes a fixed portion fixed to the top surface of a sensor element supporting portion of a casing, an upper detection arm and a lower detection arm, each of them being connected to the fixed portion on sides opposite to each other and extending along a plane parallel to the top surface of the sensor element supporting portion, and a pair of upper vibration arms connected to the fixed portion in such a manner as to form a pair of arms with the upper detection arm in between and extending in a direction parallel to the extending direction of the upper detection arm.

9 Claims, 19 Drawing Sheets

ANGULAR VELOCITY SENSOR AND ANGULAR VELOCITY SENSING DEVICE

CROSS REFERENCE TO RELATED APPLICATIONS

The present invention contains subject matter related to Japanese Patent Application JP 2007-091269 filed in the Japanese Patent Office on Mar. 30, 2007, the entire contents of which being incorporated herein by reference.

BACKGROUND OF THE INVENTION

1. Field of the Invention

The present invention relates to an angular velocity sensor for detecting an angular velocity of an object and an angular velocity sensing device including the same.

2. Description of the Related Art

An angular velocity sensor using the Coriolis force is generally known as an element for detecting angular velocity of objects, (for example, refer to Japanese Patent Publications No. 2003-227719, 08-128833, 2004-333460, 2005-106481 and Japanese Patent No. 3694160). The Coriolis force is generated when a vibratile mass body (base portion) is rotated, and angular velocity is detectable by detecting a vibration generated due to the Coriolis force.

In angular velocity sensors, piezoelectric elements are generally used as a means to vibrate the base portion and detect the vibration thereof. The piezoelectric element typically has a laminated structure in which a piezoelectric crystal is sandwiched by a pair of electrodes. A pair of the piezoelectric elements are disposed in parallel on the surface of the base portion along a direction orthogonal to the expanding or contracting direction of the piezoelectric elements. With this arrangement, the base portion can be bent and vibrated in the arrangement direction by expanding one of the piezoelectric elements and contracting the other of the piezoelectric elements. When the base portion is bent due to the Coriolis force, a voltage is generated in the piezoelectric elements due to the bending, thus angular velocity for objects can be detected by measuring a detection signal obtained from the voltage (refer to Japanese Patent Publication No. 2003-227719).

SUMMARY OF THE INVENTION

Although the angular velocity sensor has been used for technologies to autonomously control the position of a vessel, an aircraft, a rocket, etc., recently it is also mounted in small electronic equipments such as a car-navigation system, a digital camera, a video camera, and a cellular phone. Accordingly, more compact angular velocity sensor is required.

Although the angular velocity sensor may become smaller by reducing the dimension of the base portion whose occupancy is large, the amplitude obtained from the vibration of the base portion will also become smaller in accordance with the dimensional reduction. As a result, there is a possibility that detection signals are attenuated and this deteriorates the sensitivity of the angular velocity sensor.

The present invention has been devised in view of the above issue, and it is desirable to provide an angular velocity sensor which increases sensitivity even when the dimension of the base portion is reduced, and an angular velocity sensing device including the same.

An angular velocity sensor of the present invention includes a base portion extending in one direction and a plurality of piezoelectric elements formed on the base portion and arranged along a width direction orthogonal to an extending direction of the base portion. Here, an arrangement width across an arrangement of the plurality of piezoelectric elements as measured in the width direction is larger than a width of the base portion.

In the angular velocity sensor of an embodiment of the present invention, the width of the arrangement, which is constituted of the plurality of piezoelectric elements disposed on the base portion, is larger than the width of the base portion. That is, the piezoelectric elements are partially protruded beyond the base portion. With this configuration, when the base portion is bent, the protruding portion of the piezoelectric elements is more bent than the base portion.

Here, in the angular velocity sensor, each of the piezoelectric elements may include a lower electrode, a piezoelectric layer, and an upper electrode layered in this order on the base portion. In the arrangement of the plurality of piezoelectric elements, arrangement widths of at least the lower electrode and the piezoelectric layer, as measured in the width direction may be larger than the width of the base portion. In this case, the piezoelectric element may include layers other than the above-mentioned lower electrode, piezoelectric layer and upper electrode therein. For example, a foundation layer may be disposed under the lower electrode (inserted between the base portion and the lower electrode) to inhibit reaction between the base portion material and the lower electrode material, or to improve adhesiveness of the lower electrode to the base portion.

It is also possible to form rest portions other than the upper electrode of each of the piezoelectric elements integrally with each other, and to form the piezoelectric elements integrally with the base portion or formed to be stuck on the base portion. The piezoelectric elements may be formed symmetrically with respect to a centerline of the base portion. The base portion may have a constriction narrowed in width, in a region where the piezoelectric elements are formed.

An angular velocity sensing device of an embodiment of the present invention includes an angular velocity sensor and an integrated circuit element. Here, the angular velocity sensor including a first base portion extending in a first direction, and a plurality of first piezoelectric elements formed on the first base portion and arranged along a width direction orthogonal to the first direction. An arrangement width across a first arrangement of the plurality of first piezoelectric elements as measured in the width direction is larger than a width of the first base portion. The integrated circuit element receives a detection signal outputted from the plurality of first piezoelectric elements.

In the angular velocity sensor of an embodiment of the present invention, the width of the first arrangement, which is constituted of the plurality of first piezoelectric elements disposed on the first base portion, is larger than the width of the first base portion. That is, the first piezoelectric elements are partially protruded beyond the first base portion. With this configuration, when the first base portion is bent, the protruding portion of the first piezoelectric elements is more bent than the first base portion.

Preferably, the angular velocity sensor may further includes a second base portion coupled to the first base portion directly or indirectly and extends in a second direction, and a plurality of second piezoelectric elements formed on the second base portion and arranged along a width direction orthogonal to the second direction. Here, an arrangement width across a second arrangement of the plurality of second piezoelectric elements as measured in the width direction may be larger than a width of the second base portion. The integrated circuit element may transmit a driving signal to the plurality of second piezoelectric elements.

EFFECTS OF THE INVENTION

According to the angular velocity sensor of an embodiment of the present invention, the width of the arrangement, which is constituted of the plurality of piezoelectric elements disposed on the base portion, is larger than the width of the base portion. With this configuration, when the base portion is bent, the protruding portion of the plurality of piezoelectric elements is more bent than the base portion. Thus the piezoelectric elements can generate higher voltage than the case when the piezoelectric elements are arranged in such a manner that the width across the arrangement of the piezoelectric elements disposed on the base portion is equal to the width of the base portion. As a result, higher sensitivity is obtainable for the sensor elements.

In the angular velocity sensor of an embodiment of the present invention, since the width of the first arrangement, which is constituted of the plurality of first piezoelectric elements disposed on the first base portion, is made larger than the width of the first base portion. Accordingly, when the first base portion is bent, the protruding portion of the first piezoelectric elements is more bent than the first base portion. Thus the first piezoelectric elements can generate higher voltage than the case when the first piezoelectric elements are arranged in such a manner that the width across the first arrangement of the first piezoelectric elements disposed on the first base portion is equal to the width of the first base portion. As a result, higher sensitivity is obtainable for the sensor elements.

When the angular velocity sensor further includes the second base portion coupled to the first base portion directly or indirectly and extends in a second direction, and the plurality of second piezoelectric elements disposed on the second base portion and arranged along the width direction orthogonal to the second direction, and when the arrangement width across the second arrangement of the plurality of second piezoelectric elements as measured in the width direction is made larger than the width of the second base portion, and when the integrated circuit element is functioned to transmit a driving signal to the plurality of second piezoelectric elements, the second base portion can be vibrated with less electric power as with the above.

Other and further objects, features and advantages of the invention will appear more fully from the following description.

DESCRIPTION OF THE PREFERRED EMBODIMENTS

Embodiments of the present invention will be described in detail hereinbelow with reference to the drawings.

Figure 1:
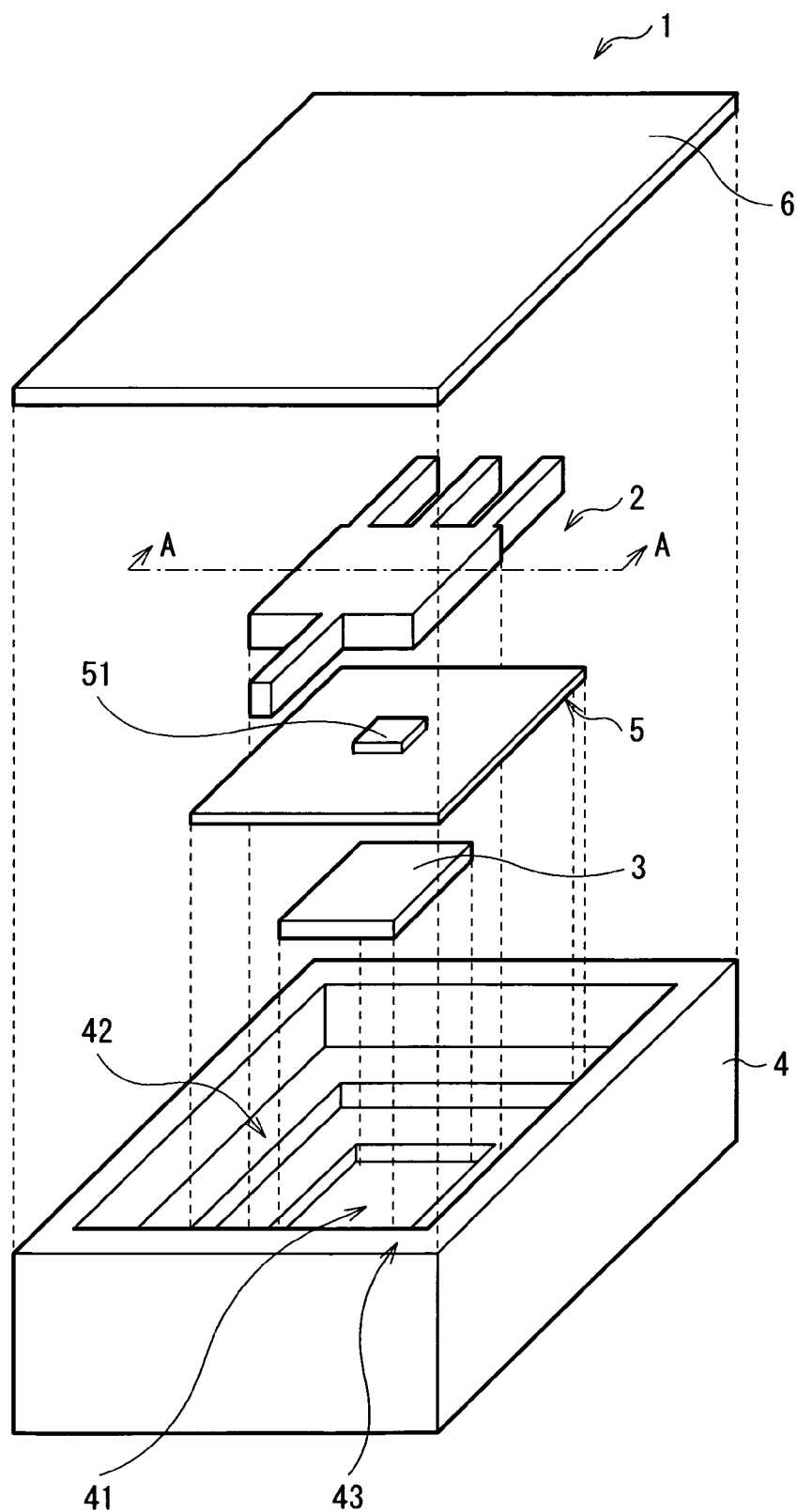
FIG. 1 is an exploded perspective view showing an angular velocity sensing device according to one embodiment of the present invention.
Figure 2:
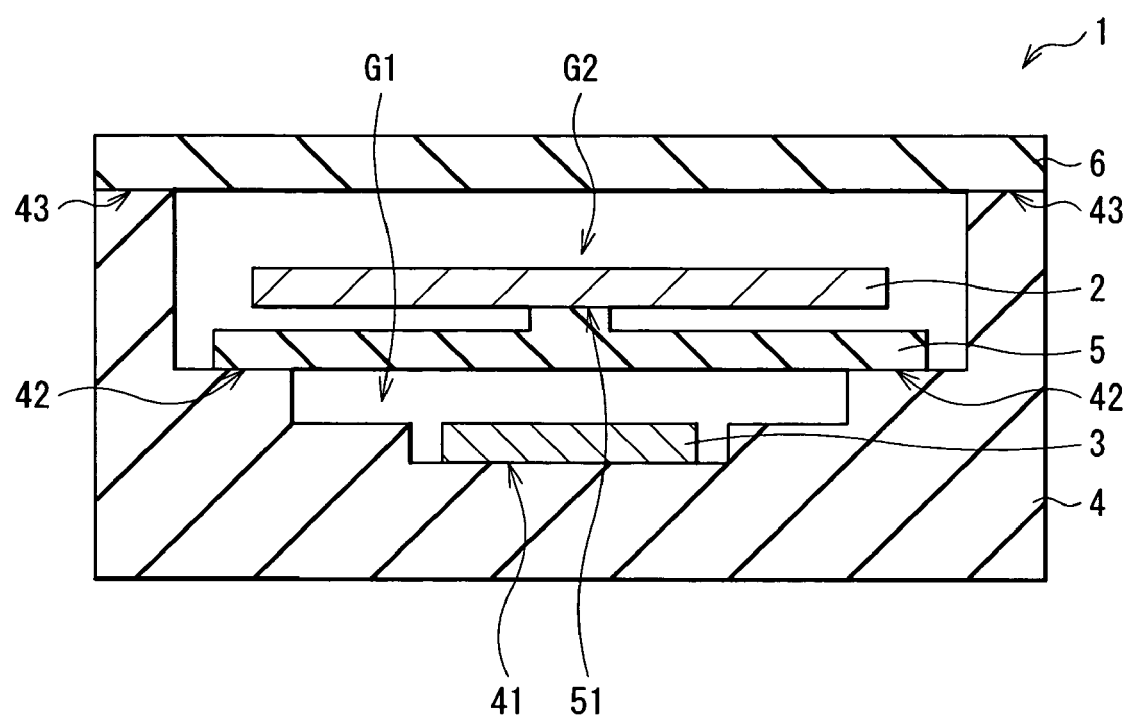
FIG. 2 is a cross sectional view showing a configuration taken along line A-A of FIG. 1, as seen from the direction indicated by the arrows.

Configuration of an angular velocity sensing device according to an embodiment of the present invention will be described hereinbelow. FIG. 1 is a perspective view showing a disassembled internal configuration of the angular velocity sensing device 1 according to the embodiment. FIG. 2 is a sectional view showing a cross-sectional configuration of the angular velocity sensing device 1 taken along line A-A thereof, as seen from the direction indicated by the arrows.

The angular velocity sensing device 1 includes, for example, an integrated circuit element 3 disposed in an internal space G1 (refer to FIG. 2) formed by being surrounded by a casing 4 and an inner-cover section 5, both of which being fit into each other. The angular velocity sensing device 1 also includes, for example, an angular velocity sensor 2 disposed in an internal space G2 (refer to FIG. 2) formed by being surrounded by the casing 4 and a top-cover section 6, both of which being fit into each other.

The integrated circuit element 3 transmits a driving signal to each piezoelectric element provided in each drive arm of the angular velocity sensor 2 and also receives a detection signal outputted from each piezoelectric element provided in each detection arm of the angular velocity sensor 2, as described later. The casing 4 is formed typically by layering a plurality of ceramic thin plates so as to have stepped depressions therein having a plurality of layers, so that it can house both of the angular velocity sensor 2 and the integrated circuit element 3 in the respective layers. The inner-cover section 5 and the top-cover section 6 are typically formed of the same ceramic material as that of the casing 4.

As shown in FIG. 1, an integrated circuit supporting portion 41 with a rectangular shape is formed in the deepest layer of the depressions in the casing 4, and the integrated circuit element 3 is disposed thereon. An inner-cover section supporting portion 42 with a rectangular shape is formed in the periphery of the integrated circuit supporting portion 41, in a layer shallower (upper) than that of the integrated circuit supporting portion 41, and the inner-cover section 5 is disposed on the inner-cover section supporting portion 42 like a simple beam supported at both ends. A sensor element supporting portion 51 (support surface) is formed in the center of the inner-cover section 5, and the angular velocity sensor 2 is arranged on the sensor element supporting portion 51. In addition, a top-cover section supporting portion 43 with a rectangular shape, which is an outer edge of the whole depressions, is formed around in the periphery of the inner-cover section supporting portion 42. The top-cover section supporting portion 43 and the top-cover section 6 are fit into each other to seal the depressions in the casing 4 from the outside, thereby forming the internal space G2 (refer to FIG. 2).

The angular velocity sensor 2 is formed along a plane parallel to the top surface of the sensor element supporting portion 51 provided on the inner-cover section 5, as shown in FIGS. 1 and 2. That is, the angular velocity sensor 2 herein has a configuration of what is called a horizontally located type.

Figure 3:
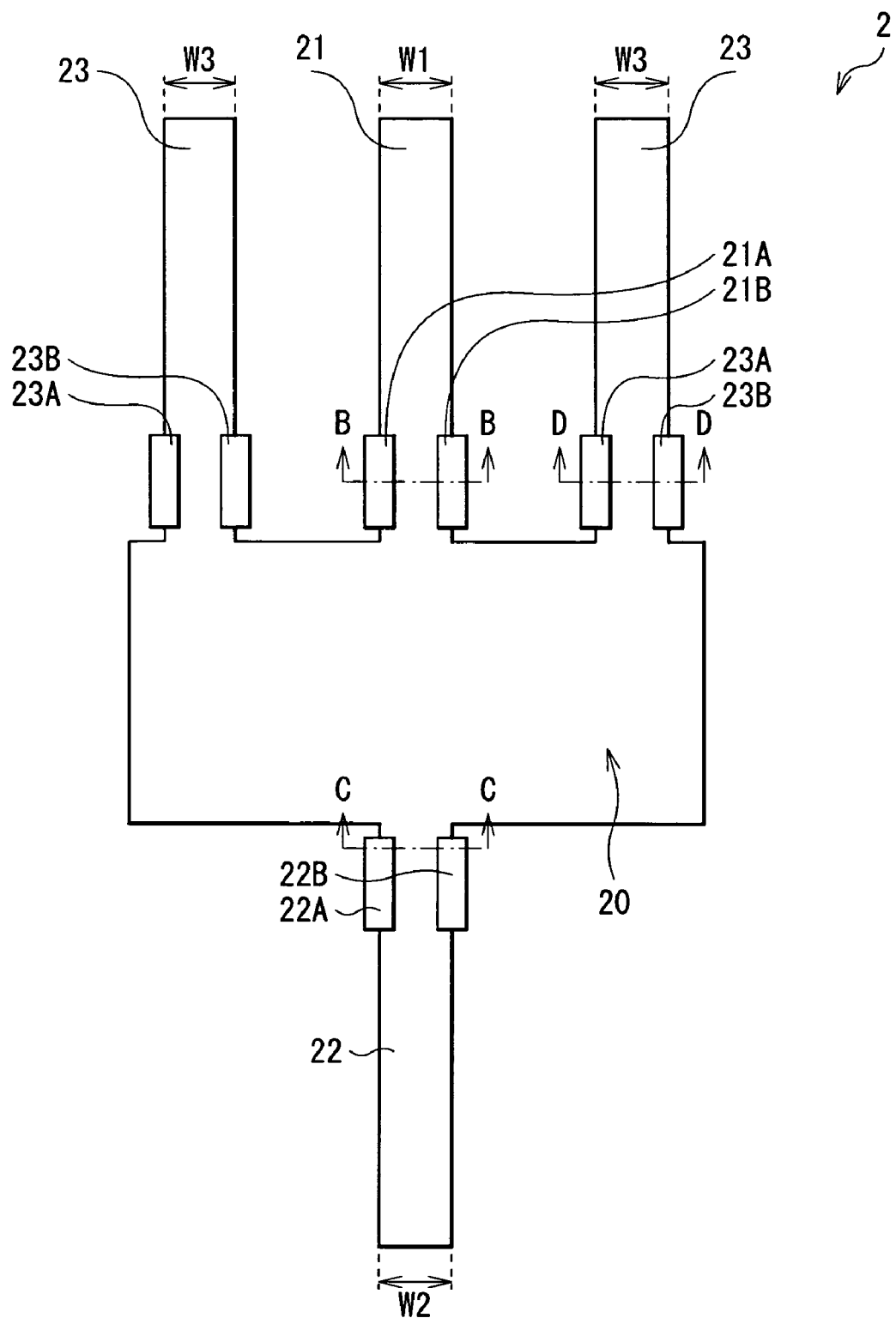
FIG. 3 is a top surface block diagram of an angular velocity sensor of FIG. 1.
Figure 4:
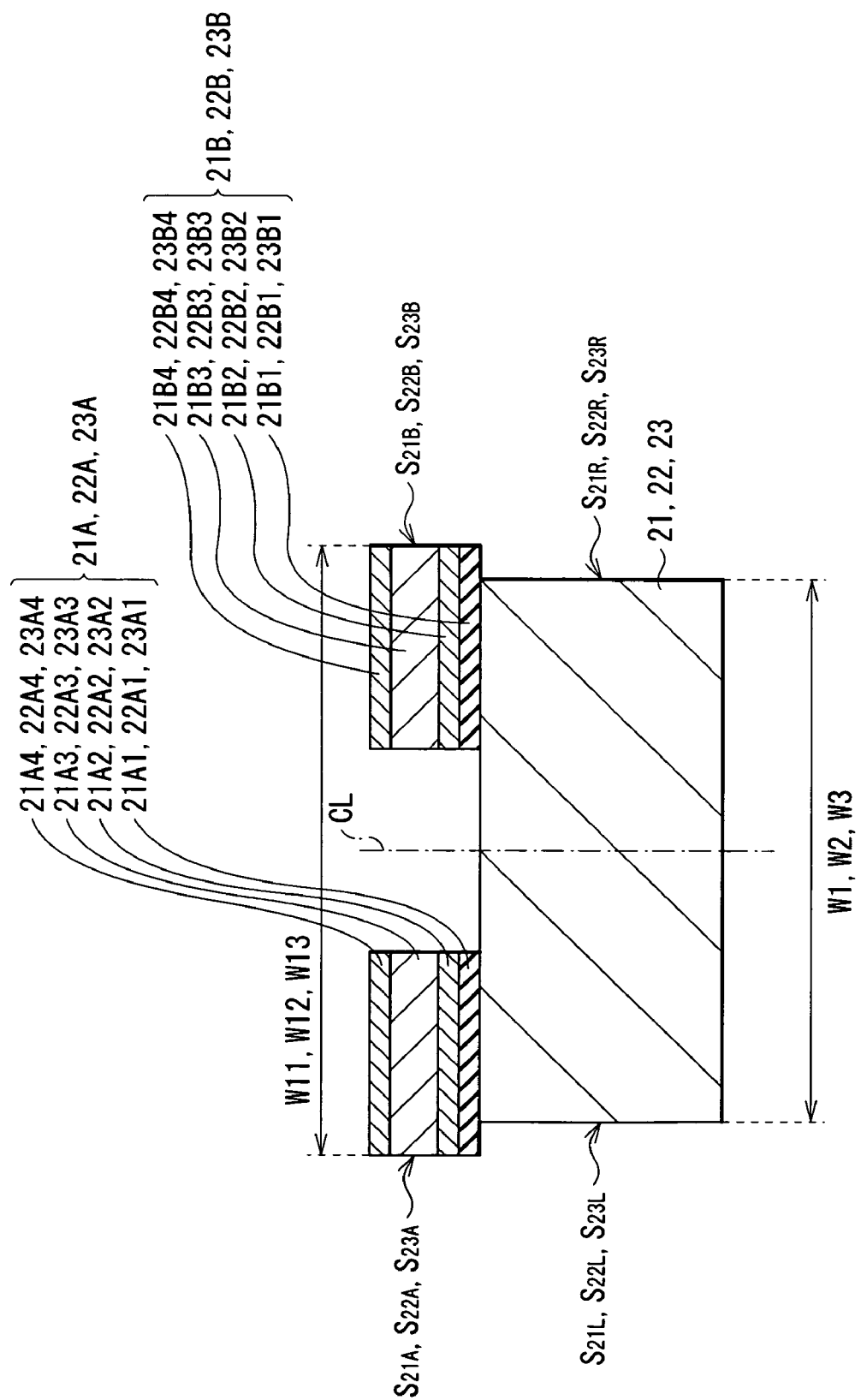
FIG. 4 is a cross sectional view collectively showing a configuration taken along lines B-B, C-C and D-D of the angular velocity sensor of FIG. 3, as seen from the directions indicated by the arrows.

FIG. 3 is a plan view showing an example of top surface configuration of the angular velocity sensor 2, and FIG. 4 is a sectional view collectively showing examples of the cross-sectional configurations taken along lines B-B, C-C and D-D of FIG. 3 as seen from the directions indicated by the arrows. The angular velocity sensor 2 includes a fixed portion 20 that is fixed onto the sensor element supporting portion 51, an upper detection arm 21 (base portion) and a lower detection arm 22 (base portion) respectively connected to the both sides (upper side and lower side as viewed in a plan view of FIG. 3) of the fixed portion 20, and a pair of upper drive arms 23 (base portions) respectively connected to the fixed portion 20 in such a manner as to form a pair of arms with the upper detection arm 21 in between.

Here, the term "upper", which is included in the base portion naming such as "upper detection arm 21" and "upper drive arms 23", indicates an upper portion of the fixed portion 20, as viewed in a plan view of FIG. 3. That is used just for convenience, and never meaning any height directions. Similarly, the term "lower", which is included in the base portion naming of "lower detection arm 22", indicates a lower portion of the fixed portion 20, as viewed in a plan view of FIG. 3. That is used just for convenience, and never meaning any height directions.

As well, it is to be noted that "right-left symmetry" hereinbelow is used just for convenience to define the direction of the right-left symmetry as viewed in a plan view of the drawings. Here, the term "right-left" represents a direction orthogonal to the extending direction of the upper detection arm 21. Thus the term "right-left symmetry" represents a symmetry with respect to the extending direction of the upper detection arm 21.

The fixed portion 20 has a function of floating the upper detection arm 21, the lower detection arm 22, and the pair of upper drive arms 23 inside the internal space G2. For example, as shown in FIG. 2, the bottom of the fixed portion 20 is partially in contact with the upper surface of the sensor element supporting portion 51 of the casing 4.

It is to be noted that the angular velocity sensor 2 is not limited to the configuration in which the bottom of the fixed portion 20 is directly fixed onto the sensor element supporting portion 51. For example, a pair of rectangular fixed beam portions respectively connected to either end of the fixed portion 20 and a pair of rectangular fixed end portions respectively connected to either end of the pair of fixed beam portions may be provided so that the bottoms of the respective fixed end portions may be fixed onto the upper surface of the inner-cover section supporting portion 42 of the casing 4. In this case, the inner-cover section 5 is removed. The configuration and size of the fixed portion 20 are not limited to those exemplified in FIGS. 1 and 3. Any kind of configuration and size are available as long as the upper detection arm 21, the lower detection arm 22 and the pair of upper drive arms 23 can float in midair.

The upper detection arm 21 and the lower detection arm 22 generate a vibration in accordance with the magnitude of a distortion of the fixed portion 20 when the distortion thereof generated by the application of the Coriolis force to the pair of upper drive arms 23 has been transmitted to the upper detection arm 21 and the lower detection arm 22. The upper detection arm 21 is connected to one side of the fixed portion 20, and extending away from the fixed portion 20 along a plane parallel to the top surface of the sensor element supporting portion 51. On the other hand, the lower detection arm 22 is connected to the fixed section 20 on the side opposite to the upper detection arm 21, and extending away from the fixed portion 20 along the plane parallel to the top surface of the sensor element supporting portion 51.

Although it is preferred that both of the upper detection arm 21 and the lower detection arm 22 extend in directions parallel to each other, they may be extending in mutually intersecting directions with a given angle. It is also preferred that the upper detection arm 21 and the lower detection arm 22 are configured to extend symmetrically with respect to a symmetry axis passing through the center of the fixed portion 20 and extending in a direction orthogonal to the extending direction of the upper detection arm 21. However, other configuration is also available.

The upper drive arm 23 generates the Coriolis force thereon when an object, which is equipped with the angular velocity sensing device 1 thereupon, rotates with respect to a rotation axis extending in a direction perpendicular to a plane including the top surface of the sensor element supporting portion 51 (namely, a direction vertical to the face of the paper of FIG. 3). Each of the upper drive arms 23 is connected to the fixed portion 20 on the same side where the upper detection arm 21 are connected and extending away from the fixed portion 20 along the plane parallel to the top surface of the sensor element supporting portion 51.

Each of the upper drive arms 23 is disposed separately from the upper detection arm 21 with an appropriate distance to avoid collision with each other when they are all vibrating simultaneously. It is preferred that the upper drive arms 23 extend in directions parallel to each other, but they may extend in mutually-intersecting directions with a given angle. It is also preferred that the upper drive arms 23 are configured to extend symmetrically with respect to the upper detection arm 21 (right-left symmetry), but they may not be always configured in such a manner. It is also preferred that the upper detection arm 21, the lower detection arm 22, and the pair of upper drive arms 23 extend in directions parallel to each other, but they may extend in mutually intersecting directions with a given angle.

Here, the fixed portion 20, the upper detection arm 21, the lower detection arm 22, and the pair of upper drive arms 23 can be typically made of a common material such as silicon and can be produced in bulk formation by patterning a wafer.

A pair of piezoelectric elements 21A and 21B are formed upon the face of the upper detection arm 21 in such a manner as to extend in a direction parallel to the extending direction of the upper detection arm 21. The above-mentioned pair of piezoelectric elements 21A and 21B have a function of detecting vibrations of the upper detection arm 21 when it vibrates along the plane parallel to the top surface of the sensor element supporting portion 51 of the casing 4, and are preferably arranged side by side along a width direction of the upper detection arm 21. It is also preferred that the piezoelectric elements 21A and 21B are arranged symmetrically with respect to a centerline CL of the upper detection arm 21 shown in FIG. 4.

A pair of piezoelectric elements 22A and 22B are formed upon the face of the lower detection arm 22 in such a manner as to extend in a direction parallel to an extending direction of the lower detection arm 22. As with the pair of piezoelectric elements 21A and 21B, the pair of piezoelectric elements 22A and 22B have a function of detecting a vibration of the lower detection arm 22 when it vibrates along the plane parallel to the top surface of the sensor element supporting portion 51 of the casing 4. It is preferred that the pairs of piezoelectric elements 22A and 22B are arranged side by side along the width direction of the lower detection arm 22. It is preferred that the piezoelectric elements 22A and 22B are arranged symmetrically with respect to the centerline CL of the lower detection arm 22.

A pair of piezoelectric elements 23A and 23B are formed upon the face of each of the upper drive arms 23 in such a manner as to extend in a direction parallel to an extending direction of the upper drive arms 23. The pair of piezoelectric elements 23A and 23B serve to vibrate the respective upper drive arms 23 along the plane parallel to the top surface of the sensor element supporting portion 51 of the casing 4, and preferably are arranged side by side along the width direction of the upper drive arms 23. It is preferred that the piezoelectric elements 23A and 23B are arranged symmetrically with respect to the centerline CL of each of the upper drive arms 23.

Here, the piezoelectric elements 21A, 22A and 23A are typically formed by respectively layering: foundation layers 21A1, 22A1 and 23A1, lower electrodes 21A2, 22A2 and 23A2, piezoelectric layers 21A3, 22A3 and 23A3, and upper electrodes 21A4, 22A4 and 23A4 in this order, on the upper detection arm 21, the lower detection arm 22, and the upper drive arms 23 respectively, as shown in FIG. 4. The piezoelectric elements 21B, 22B and 23B are typically formed by respectively layering: foundation layers 21B1, 22B1 and 23B1, lower electrodes 21B2, 22B2 and 23B2, piezoelectric layers 21B3, 22B3 and 23B3, and upper electrodes 21B4, 22B4 and 23B4 in this order, on the upper detection arm 21, the lower detection arm 22, and the upper drive arms 23 respectively, as shown in FIG. 4. That is, the piezoelectric elements 21A, 22A and 23A and the piezoelectric elements 21B, 22B and 23B are formed independently of each other.

Here, as shown in FIG. 4 for example, a width W11 across the arrangement of the piezoelectric elements 21A and 21B, as measured in the direction orthogonal to the extending direction of the upper detection arm 21, is larger than a width W1 of the upper detection arm 21 as measured in the direction orthogonal to the extending direction of the upper detection arms 21, for example. Similarly, a width W12 across the arrangement of the piezoelectric elements 22A and 22B, as measured in the direction orthogonal to the extending direction of the lower detection arm 22, is larger than a width W2 of the lower detection arm 22 as measured in the direction orthogonal to the extending direction of the lower detection arm 22. Similarly, a width W13 across the arrangement of the piezoelectric elements 23A and 23B, as measured in the direction orthogonal to the extending direction of the upper drive arm 23, is larger than a width W3 of the upper drive arm 23 as measured in the direction orthogonal to the extending direction of the upper drive arm 23.

In other words, for example, an outer edge $S_{21A}$ of the piezoelectric element 21A (the side opposite to the piezoelectric element 21B) protrudes beyond an edge $S_{21L}$ of the upper detection arm 21, and an outer edge $S_{21B}$ of the piezoelectric element 21B (the side opposite to the piezoelectric element 21A) protrudes beyond an edge $S_{21R}$ of the upper detection arm 21, as shown in FIG. 4. Similarly, an outer edge $S_{22A}$ of the piezoelectric element 22A (the side opposite to the piezoelectric element 22B) protrudes beyond an edge $S_{22L}$ of the lower detection arm 22 and an outer edge $S_{22B}$ of the piezoelectric element 22B (the side opposite to the piezoelectric element 22A) protrudes beyond an edge $S_{22R}$ of the lower detection arm 22. In the same manner, an outer edge $S_{23A}$ of the piezoelectric element 23A (the side opposite to the piezoelectric element 23B) protrudes beyond an edge $S_{23L}$ of the upper drive arm 23, and an outer edge $S_{23B}$ of the piezoelectric element 23B (the side opposite to the piezoelectric element 23A) protrudes beyond an edge $S_{23R}$ of the upper drive arm 23.

FIG. 4 shows a case where the layer widths, as measured vertically in the laminating direction, of the piezoelectric elements 21A, 22A and 23A and the piezoelectric elements 21B, 22B and 23B are constant. Specifically, the foundation layers 21A1, 22A1 and 23A1, the lower electrodes 21A2, 22A2 and 23A2, the piezoelectric layers 21A3, 22A3 and 23A3, and the upper electrodes 21A4, 22A4 and 23A4, have the same layer width when layered on the upper detection arm 21, the lower detection arm 22 and the upper drive arm 23 respectively. As well, the foundation layer 21B1, 22B1 and 23B1, the lower electrodes 21B2, 22B2 and 23B2, the piezoelectric layers 21B3, 22B3 and 23B3, and the upper electrodes 21B4, 22B4 and 23B4 have the same width when layered on the upper detection arm 21, the lower detection arm 22 and the upper drive arm 23 respectively. In this case, widths of the individual layers or the individual piezoelectric elements may be different from one another.

Figure 5:
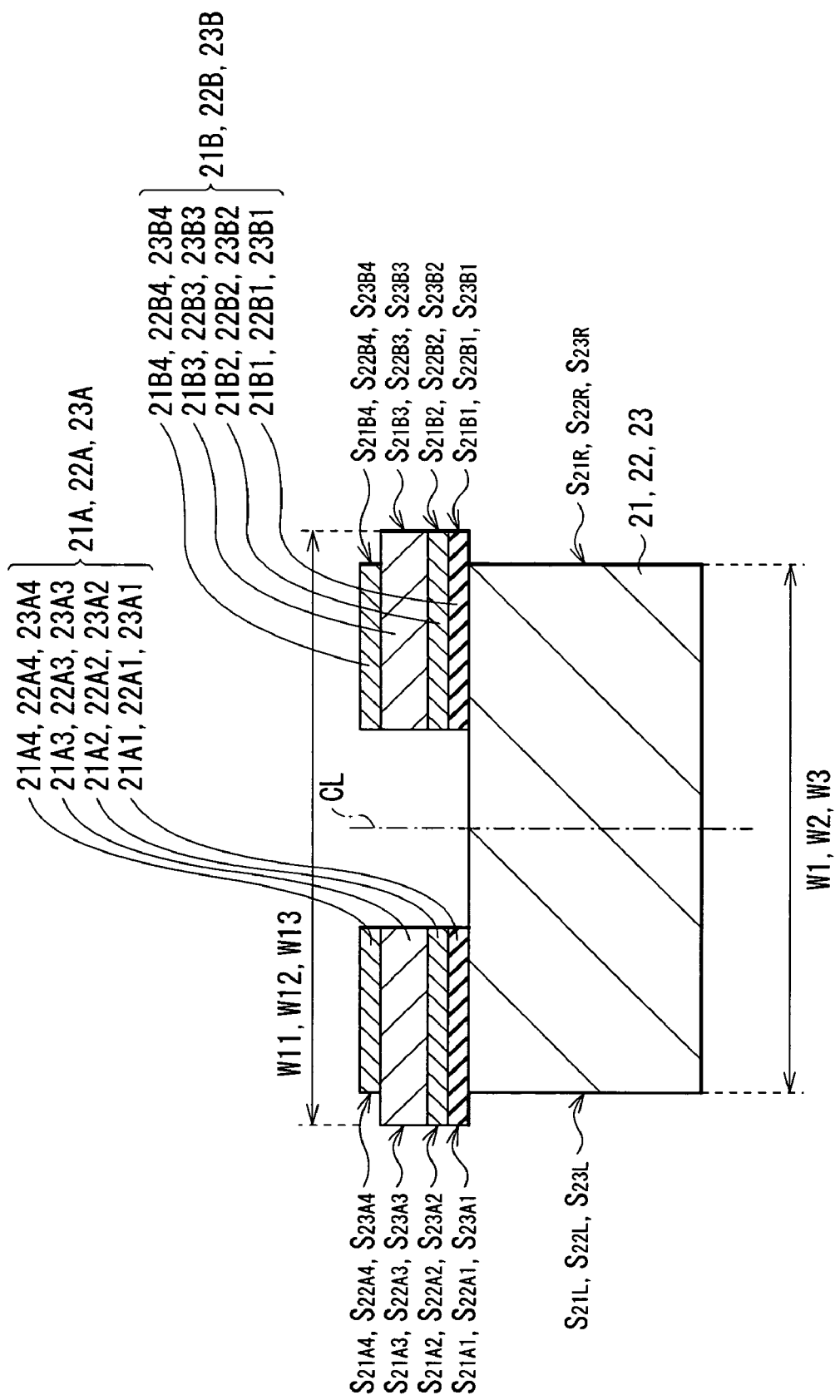
FIG. 5 is a cross sectional view of an angular velocity sensor according to one modification of FIG. 4.

For example, as shown in FIG. 5, configuration, location or size of the upper electrodes 21A4, 22A4 and 23A4 are adjustable so that the edges $S_{21A4}$ $S_{22A4}$ and $S_{23A4}$ of the upper electrodes 21A4, 22A4 and 23A4 may be recessed from the edges $S_{21A3}$, $S_{22A3}$, $S_{23A3}$ of the piezoelectric layers 21A3, 22A3 and 23A3 and the edges $S_{21A2}$, $S_{22A2}$ and $S_{23A2}$ of the lower electrodes 21A2, 22A2 and 23A2. As well, configuration, location or size of the upper electrodes 21B4, 22B4 and 23B4 are adjustable so that the edges $S_{21B4}$, $S_{22B4}$ and $S_{23B4}$ of the upper electrodes 21B4, 22B4 and 23B4 may be recessed from the edges $S_{21B3}$, $S_{22B3}$ and $S_{23B3}$ of the piezoelectric layers 21B3, 22B3 and 23B3 and the edges $S_{21B2}$, $S_{22B2}$, and $S_{23B2}$ of the lower electrodes 21B2, 22B2 and 23B2 respectively.

That is, in the arrangement of the piezoelectric elements 21A and 21B, which are composed of the lower electrodes 21A2 and 21B2, the piezoelectric layers 21A3 and 21B3 and the upper electrodes 21A4 and 21B4 respectively layered in this order, at least the width across the arrangement of the lower electrodes 21A2 and 21B2 and the width across the arrangement of the piezoelectric layers 21A3 and 21B3 need to be larger than the width of the upper detection arm 21. Similarly, in the arrangement of the piezoelectric elements 22A and 22B, which are composed of the lower electrodes 22A2 and 22B2, the piezoelectric layers 22A3 and 22B3 and the upper electrodes 22A4 and 22B4 respectively layered in this order, at least the width across the arrangement of the lower electrodes 22A2 and 22B2 and the width across the arrangement of the piezoelectric layers 22A3 and 22B3 need to be larger than the width of the lower detection arm 22. Similarly, in the arrangement of the piezoelectric elements 23A and 23B, which are composed of the lower electrodes 23A2 and 23B2, the piezoelectric layers 23A3 and 23B3 and the upper electrodes 23A4 and 23B4 respectively layered in this order, at least the width across the arrangement of the lower electrodes 23A2 and 23B2 and the width across the arrangement of the piezoelectric layers 23A3 and 23B3 needed to be larger than the width of upper drive arm 23.

It is not really an issue whether the inner-side edges of the piezoelectric elements 21A, 22A and 23A and the inner-side edges of the piezoelectric elements 21B, 22B and 23B (the sides facing the adjacent piezoelectric elements) are flat or uneven. Or the inner-side edges of the piezoelectric elements 21A, 22A, and 23A may be partially connected to the opposed inner side edges of the piezoelectric elements 21B, 22B and 23B so that adjacent two piezoelectric elements may be integrated into one piece.

Figure 6:
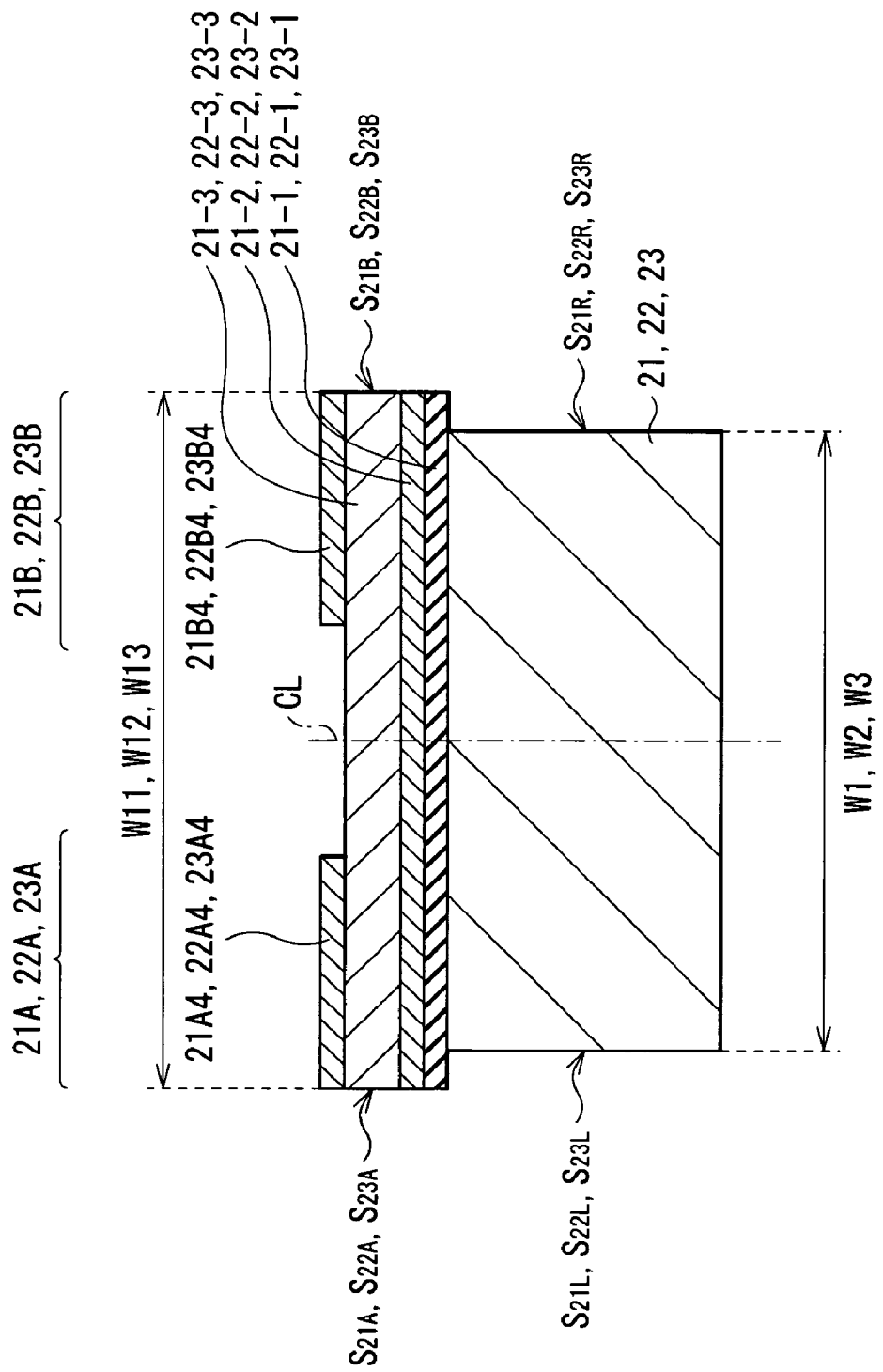
FIG. 6 is a cross sectional view of an angular velocity sensor according to another modification of FIG. 4.
Figure 7:
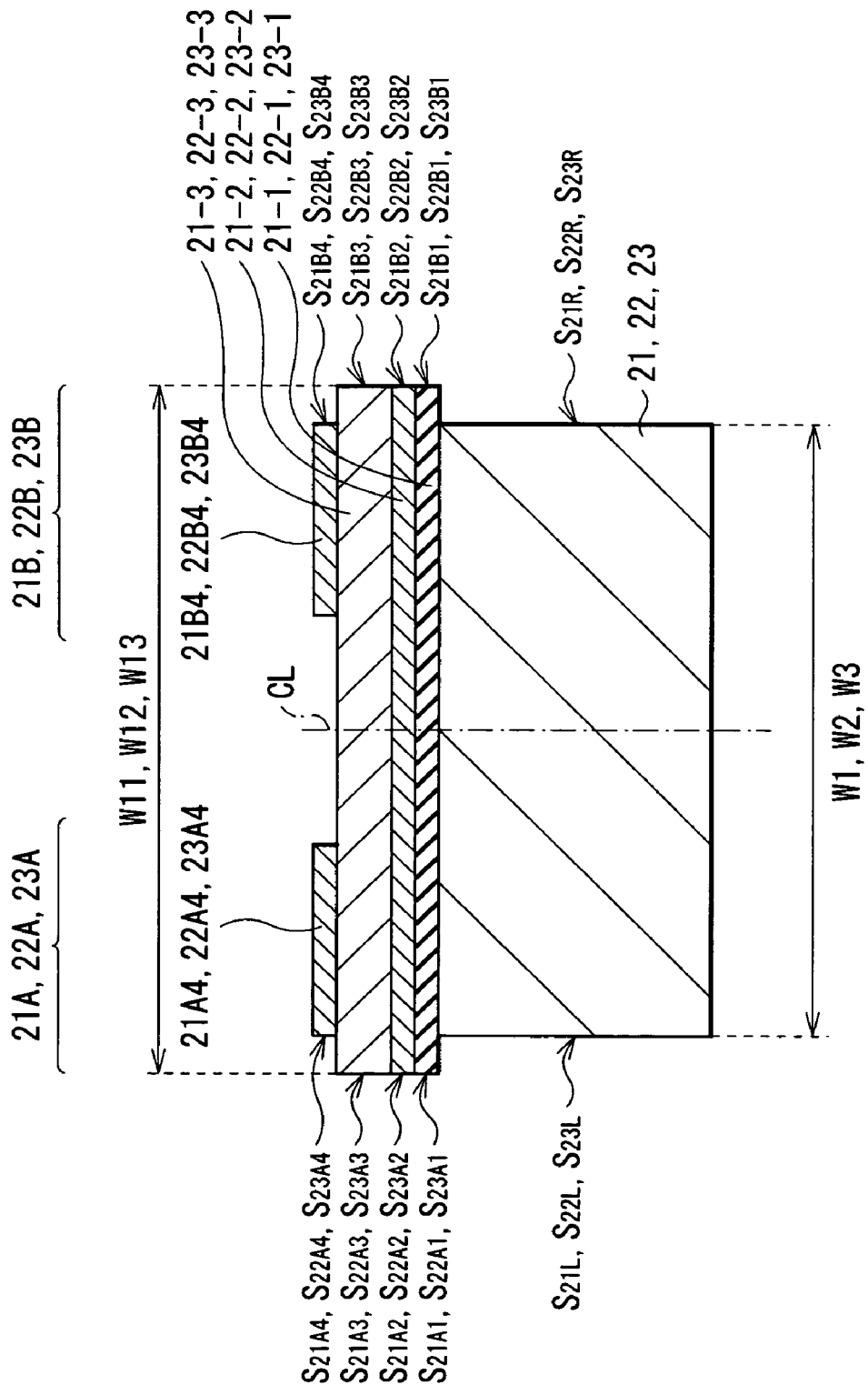
FIG. 7 is a cross sectional view of an angular velocity sensor according to another modification of FIG. 4.

For example, as shown in FIGS. 6 and 7, the foundation layers 21A1, 22A1 and 23A1, and the foundation layers 21B1, 22B1 and 23B1 may be formed from common foundation layers 21-1, 22-1, and 23-1 respectively, the lower electrodes 21A2, 22A2 and 23A2, the lower electrodes 21B2, 22B2 and 23B2 may be formed from common lower electrodes 21-2, 22-2 and 23-2 respectively, and the piezoelectric layers 21A3, 22A3 and 23A3, and the piezoelectric layers 21B3, 22B3 and 23B3 may also be formed from common piezoelectric layers 21-3, 22-3 and 23-3 respectively. In this case, the other layers (upper electrodes) may be formed separately.

Figure 8:
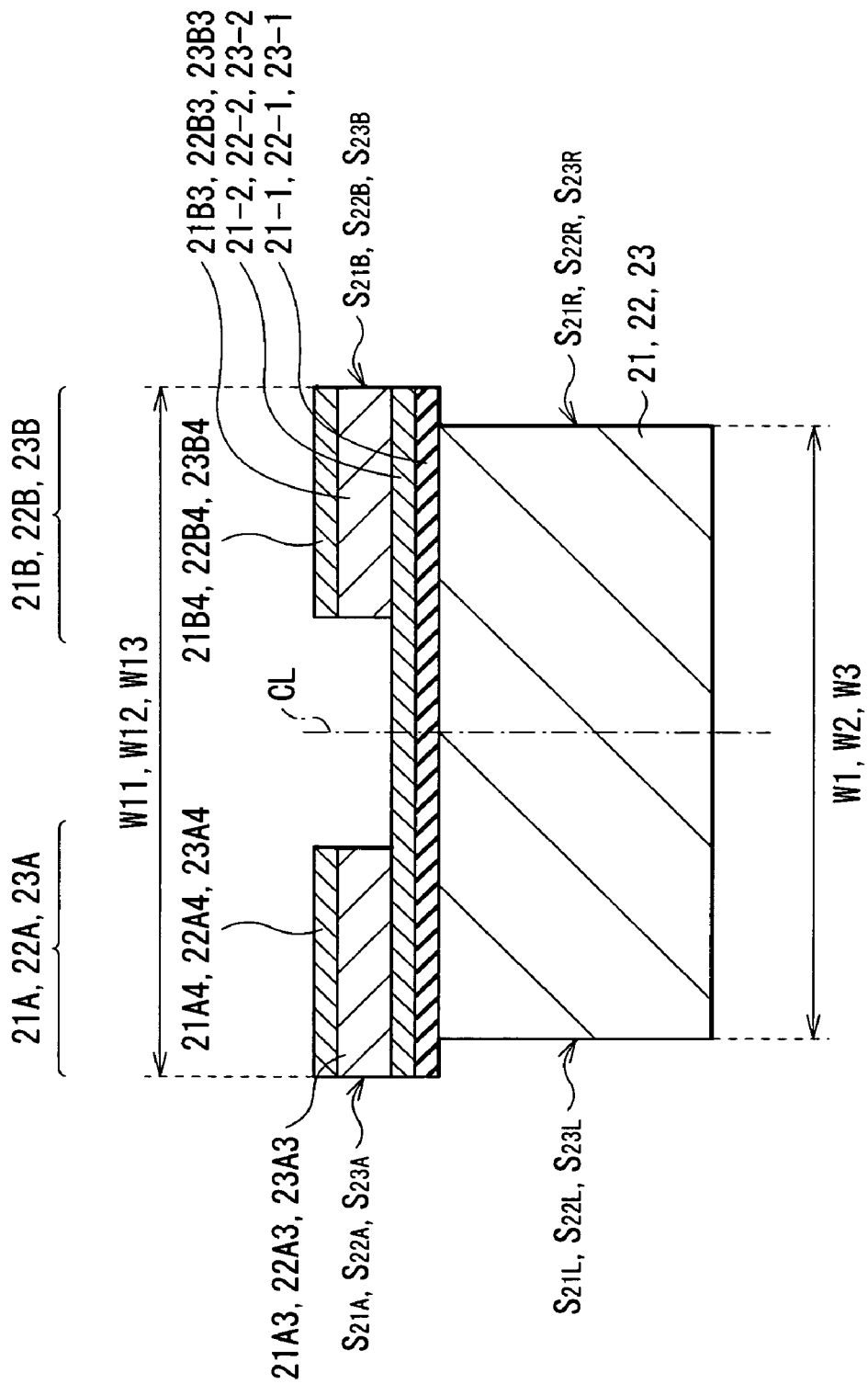
FIG. 8 is a cross sectional view of an angular velocity sensor according to still another modification of FIG. 4.
Figure 9:
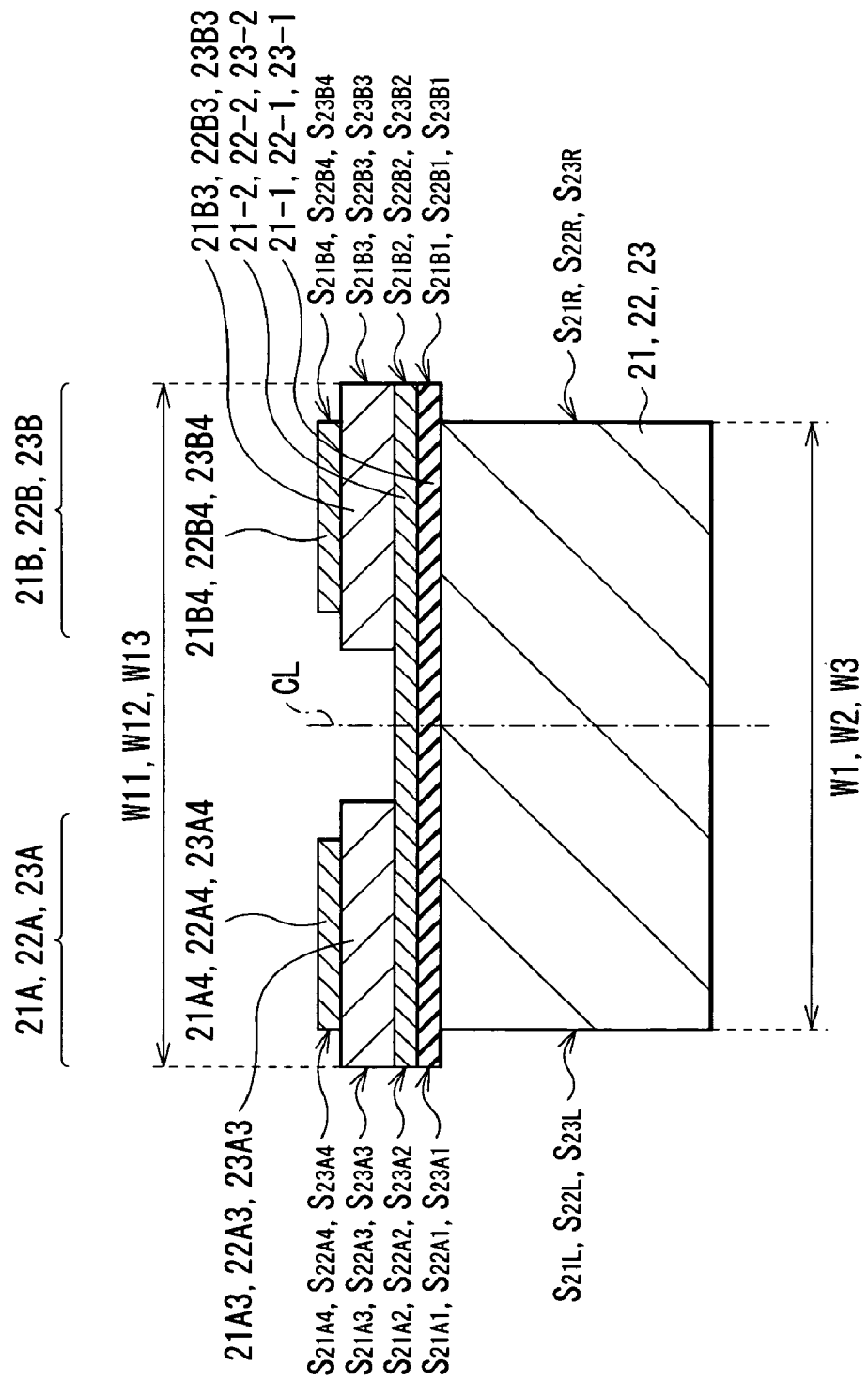
FIG. 9 is a cross sectional view of an angular velocity sensor according to still another modification of FIG. 4.

For another example, as shown in FIGS. 8 and 9, the foundation layers 21A1, 22A1 and 23A1, and the foundation layers 21B1, 22B1 and 23B1 may be formed from common foundation layers 21-1, 22-1, and 23-1 respectively, and the lower electrodes 21A2, 22A2 and 23A2, and the lower electrodes 21B2, 22B2 and 23B2 may be formed from common lower electrodes 21-2, 22-2 and 23-2 respectively. Then the other layers (piezoelectric layers and upper electrodes) may be formed separately.

Figure 10:
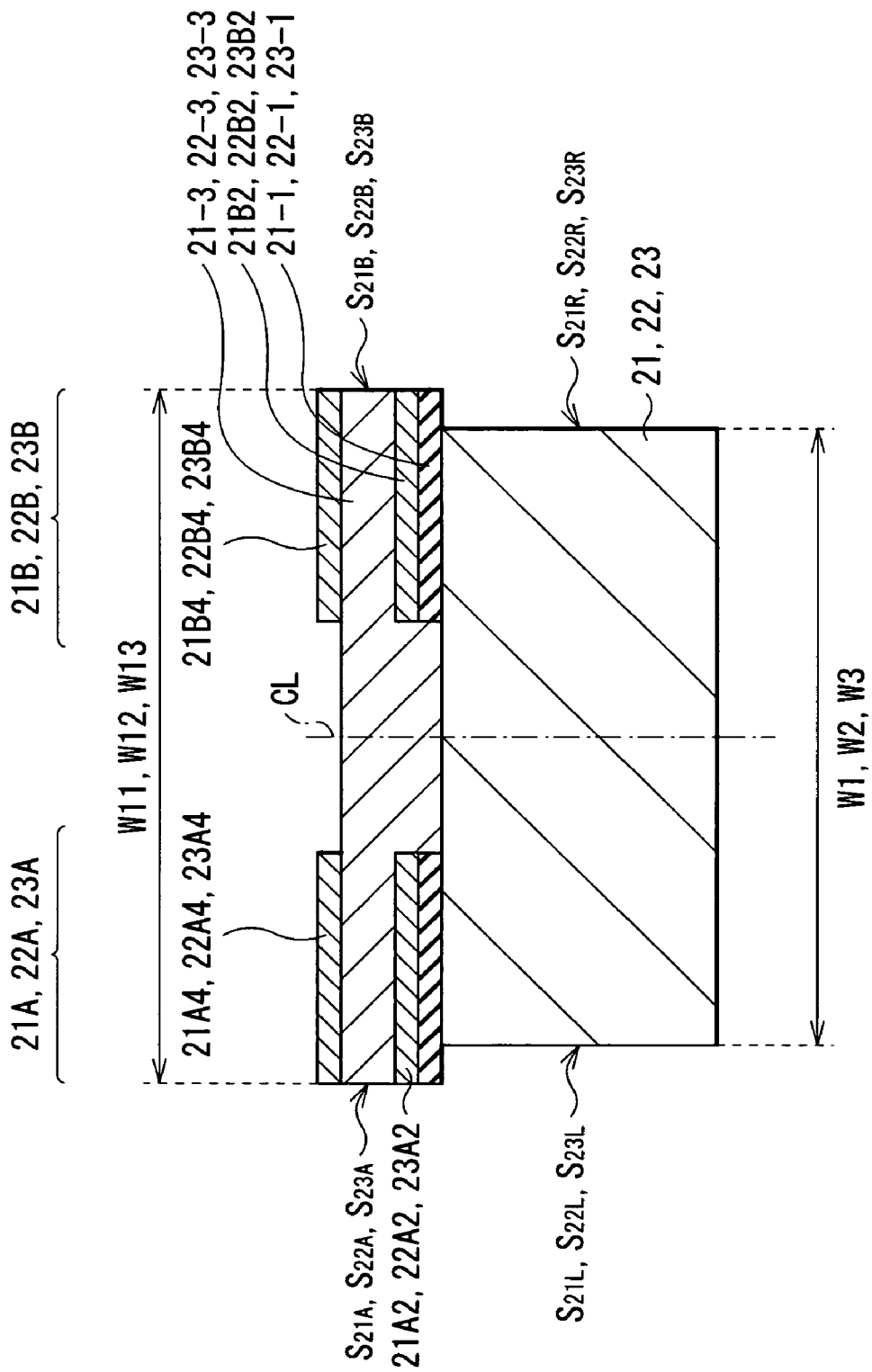
FIG. 10 is a cross sectional view of an angular velocity sensor according to still another modification of FIG. 4.
Figure 11:
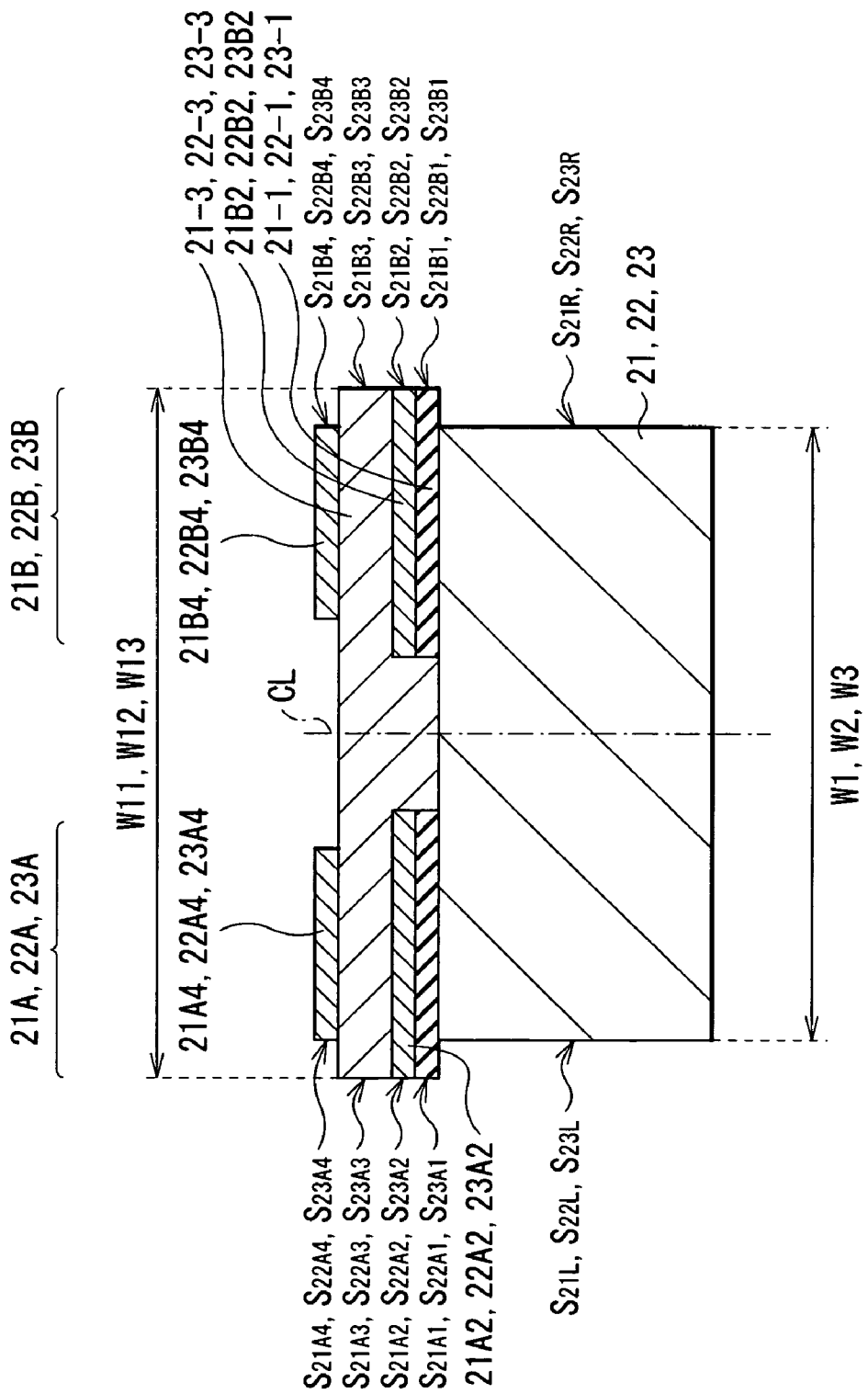
FIG. 11 is a cross sectional view of an angular velocity sensor according to still another modification of FIG. 4.

For another example, as shown in FIGS. 10 and 11, the piezoelectric layers 21A3, 22A3 and 23A3, and the piezoelectric layer 21B3, 22B3 and 23B3 may be formed from common piezoelectric layers 21-3, 22-3 and 23-3 respectively, and the other layers (foundation layers, lower electrodes and upper electrodes) may be formed separately.

Here, the foundation layers 21A1, 22A1, 23A1, 21B1, 22B1, 23B1, 21-1, 22-1 and 23-1 are disposed to inhibit reaction (alloying, for example) with the material of the lower electrodes 21A2, 22A2, 23A2, 21B2, 22B2, 23B2, 21-2, 22-2 and 23-2, or to improve adhesion of the lower electrodes 21A2, 22A2, 23A2, 21B2, 22B2, 23B2, 21-2, 22-2 and 23-2 to the upper detection arm 21, the lower detection arm 22, and the pair of upper drive arms 23 respectively. They are typically made of a multilayer of $ZrO_2$ film/$Y_2O_3$ film, an insulating layer such as $SiO_2$, or Ti (titanium) with high adhesive properties. The lower electrodes 21A2, 22A2, 23A2, 21B-2, 22B-2, 23B-2, 21-2, 22-2 and 23-2 are typically made of a Pt (100) orientation film.

The piezoelectric layers 21A3, 22A3, 23A3, 21B3, 22B3, 23B3, 21-3, 22-3 and 23-3 are typically formed including lead zirconate titanate (PZT). The upper electrodes 21A4, 22A4, 23A4, 21B4, 22B4 and 23 B4, and the lower electrodes 21A2, 22A2, 23A2, 21B2, 22B2, 23B2, 21-2, 22-2 and 23-2 are typically made of a Pt (100) oriented film.

Figure 12:
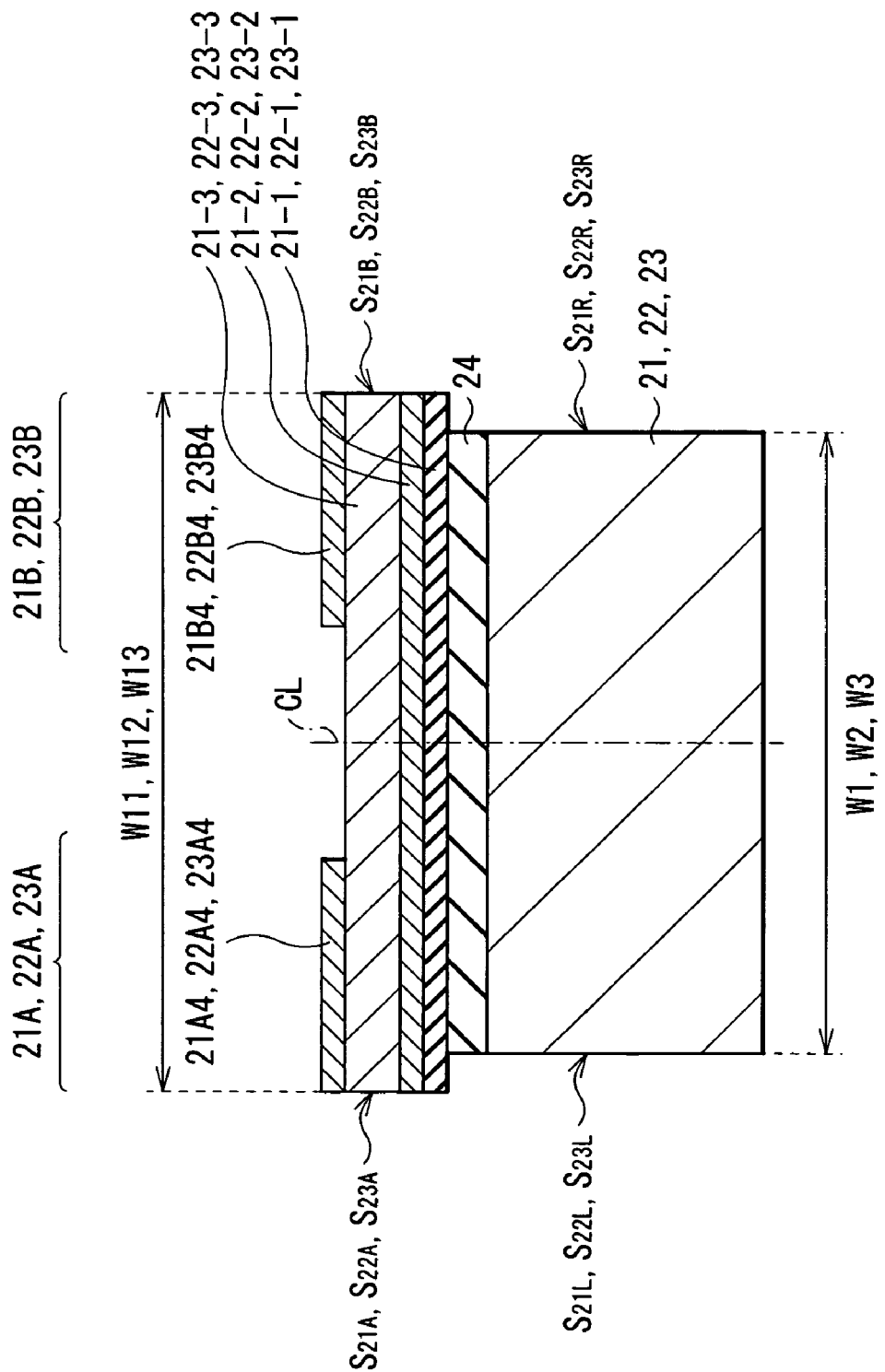
FIG. 12 is a cross sectional view of an angular velocity sensor according to still another modification of FIG. 4.

The piezoelectric elements 21A, 22A and 23A and the piezoelectric elements 21B, 22B and 23B can be formed integrally with the upper detection arm 21, the lower detection arm 22 and the pair of upper drive arms 23 respectively by a general semiconductor manufacturing process. It is also possible for example, to stick the piezoelectric elements 21A, 22A and 23A and the piezoelectric elements 21B, 22B and 23B to the upper detection arm 21, the lower detection arm 22 and the pair of upper drive arms 23 via an adhesive layer 24 of epoxy resin etc., as shown in FIG. 12.

Next, an example of manufacturing method of the angular velocity sensor 2 will be explained with reference to FIGS. 13A and 13B to FIGS. 15A and 15B.

Since the fixed portion 20, the upper detection arm 21, the lower detection arm 22 and the pair of upper drive arms 23 can be produced in bulk formation by a same formation method, and the piezoelectric elements 21A, 22A and 23A and the piezoelectric elements 21B, 22B and 23B can be produced in bulk formation by a same formation method, hereinbelow, the manufacturing method for only the upper detection arm 21 and the piezoelectric elements 21A and 21B, which constitute a part of the angular velocity sensor 2, will be described for the sake of brevity. Description hereinbelow is on the case of FIG. 6 where the piezoelectric elements 21A and 21B are formed integrally. FIGS. 13A and 13B to FIGS. 15A and 15B show a cross-sectional configuration in each manufacturing process.

Figure 13A:
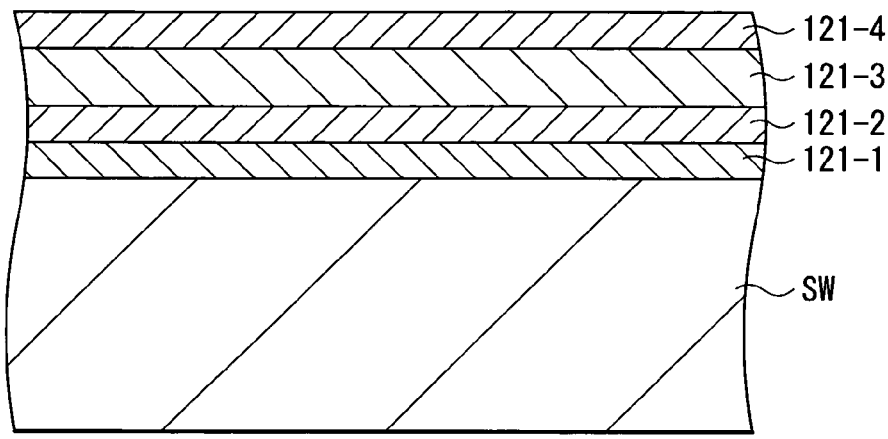
FIG. 13 is a cross sectional view for explaining the manufacturing method of the angular velocity sensor of FIG. 1.

First, a foundation layer 121-1, a lower electrode 121-2, a piezoelectric layer 121-3 and an upper electrode 121-4 are layered in this order on a silicon wafer SW using a general semiconductor manufacturing process as shown in FIG. 13A. The upper detection arm 21 will be cut out of the silicon wafer SW later. It is to be noted that the foundation layer 121-1, the lower electrode 121-2, the piezoelectric layer 121-3 and the upper electrode 121-4 show a stage previous to the formation of the foundation layer 21-1, the lower electrode 21-2, the piezoelectric layer 21-3 and the upper electrode 21-4, thus made of the same materials as the foundation layer 21-1, the lower electrode 21-2, the piezoelectric layer 21-3 and upper electrode 21-4 respectively.

Figure 13B:
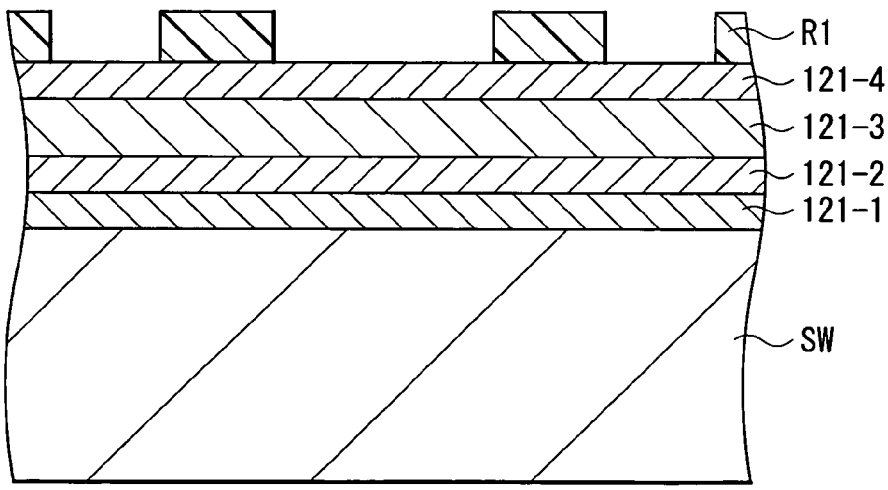
Figure 14A:
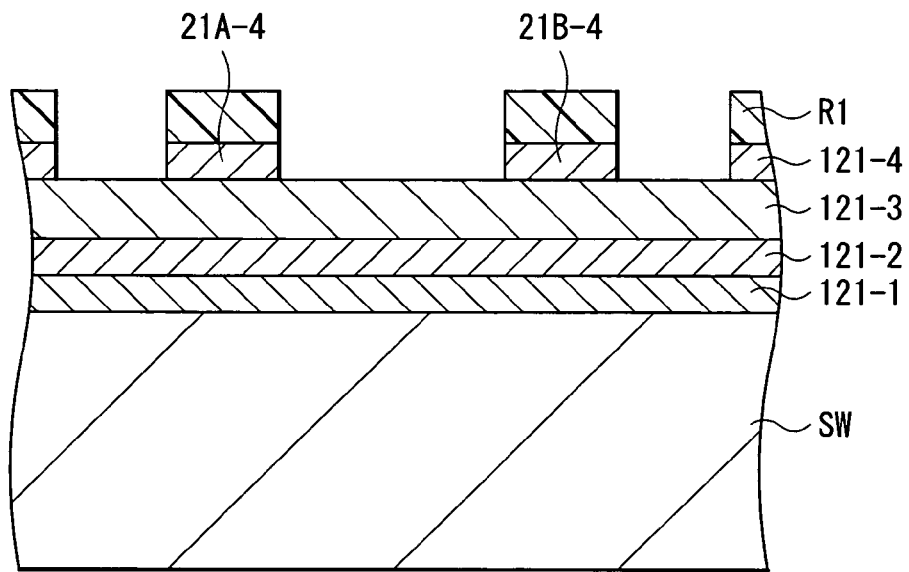
FIG. 14 is a cross sectional view for explaining a step subsequent to that of FIG. 13.

Next, a resist layer R1, which has an opening in areas other than the planned formation area for the upper electrodes 21A4 and 21B4, is formed on the upper electrode 121-4 as shown in FIG. 13B, then the upper electrode 121-4 is etched selectively after that. In this manner, the upper electrodes 21A4 and 21B4 are formed as shown in FIG. 14A.

Figure 14B:
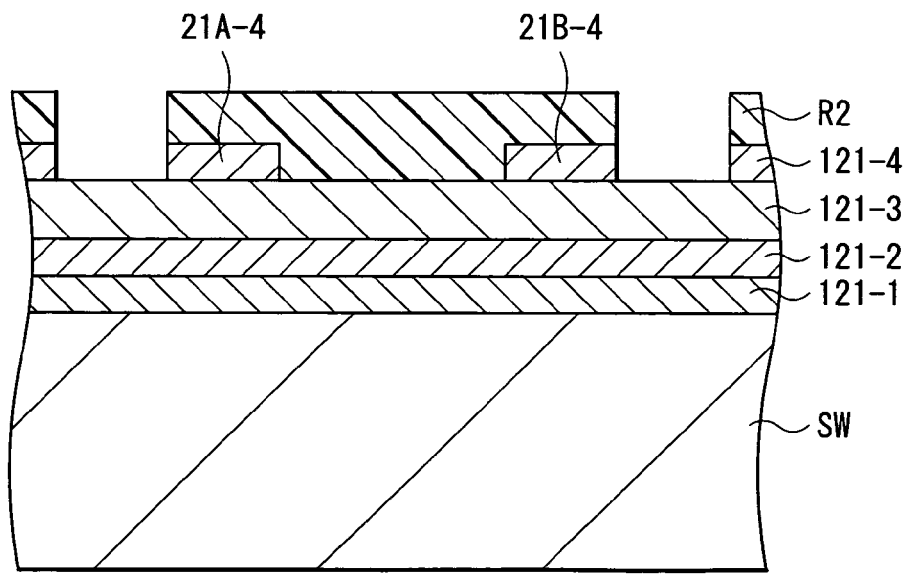
Figure 15A:
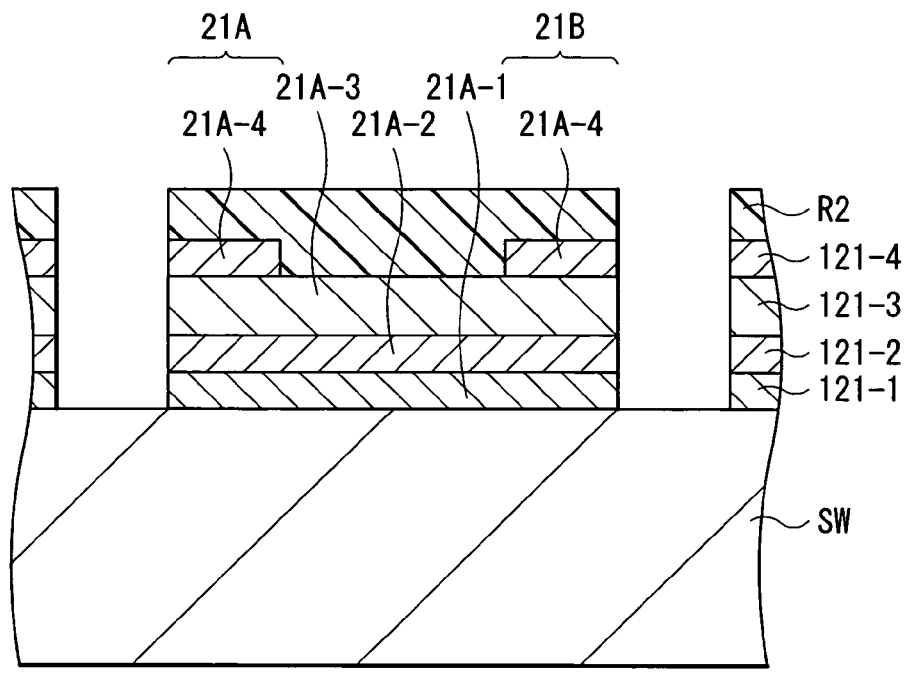
FIG. 15 is a cross sectional view for explaining a step subsequent to that of FIG. 14.

Next, after removing the resist layer R1, a resist layer R2 having an opening in areas other than the planned formation area for the piezoelectric elements 21A and 21B is newly formed as shown in FIG. 14B. Subsequently, the piezoelectric layer 121-3, the lower electrode 121-2 and the foundation layer 121-1 are selectively etched. In this manner, the piezoelectric elements 21A and 21B are formed as shown in FIG. 15A.

Figure 15B:
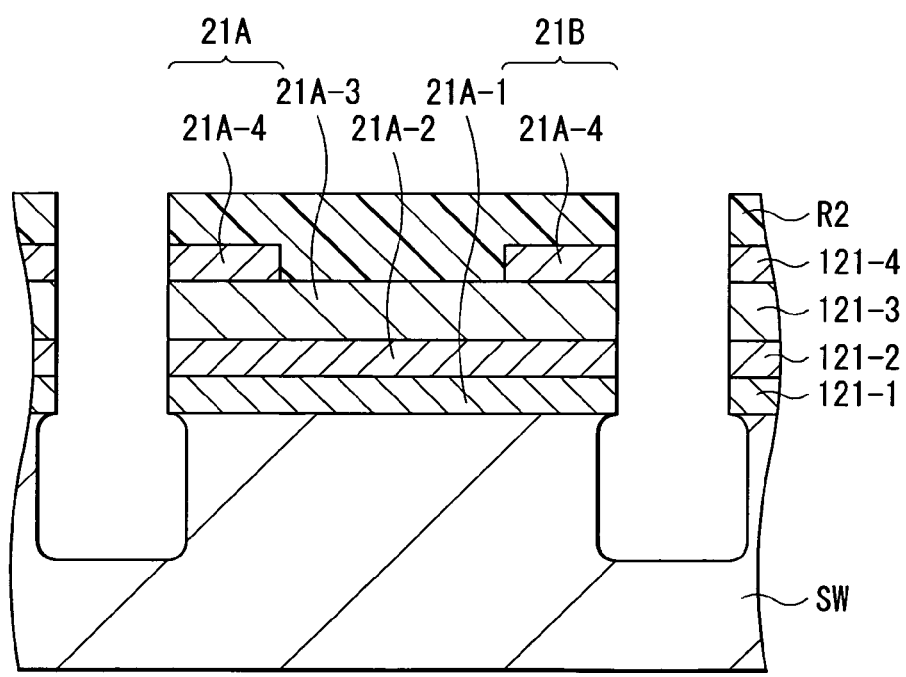

Next, the silicon wafer SW is selectively etched using a process peculiar to silicon etching as shown in FIG. 15B while the resist layer R2 still remains as it is so that the upper detection arm 21 may be cut out from the silicon wafer SW in the end. At this time, side etching is also performed to the silicon wafer SW, to the areas just under the piezoelectric elements 21A and 21B. In this manner, the width W11 across the piezoelectric elements 21A and 21B, as measured in the direction orthogonal to the extending direction of the upper detection arm 21, is larger than the width W1 of the upper detection arm 21 in the direction orthogonal to the extending direction of the upper detection arm 21 as shown in FIG. 6. In this manner, the upper detection arm 21 and the piezoelectric elements 21A and 21B of the present embodiment are completed.

Figure 16:
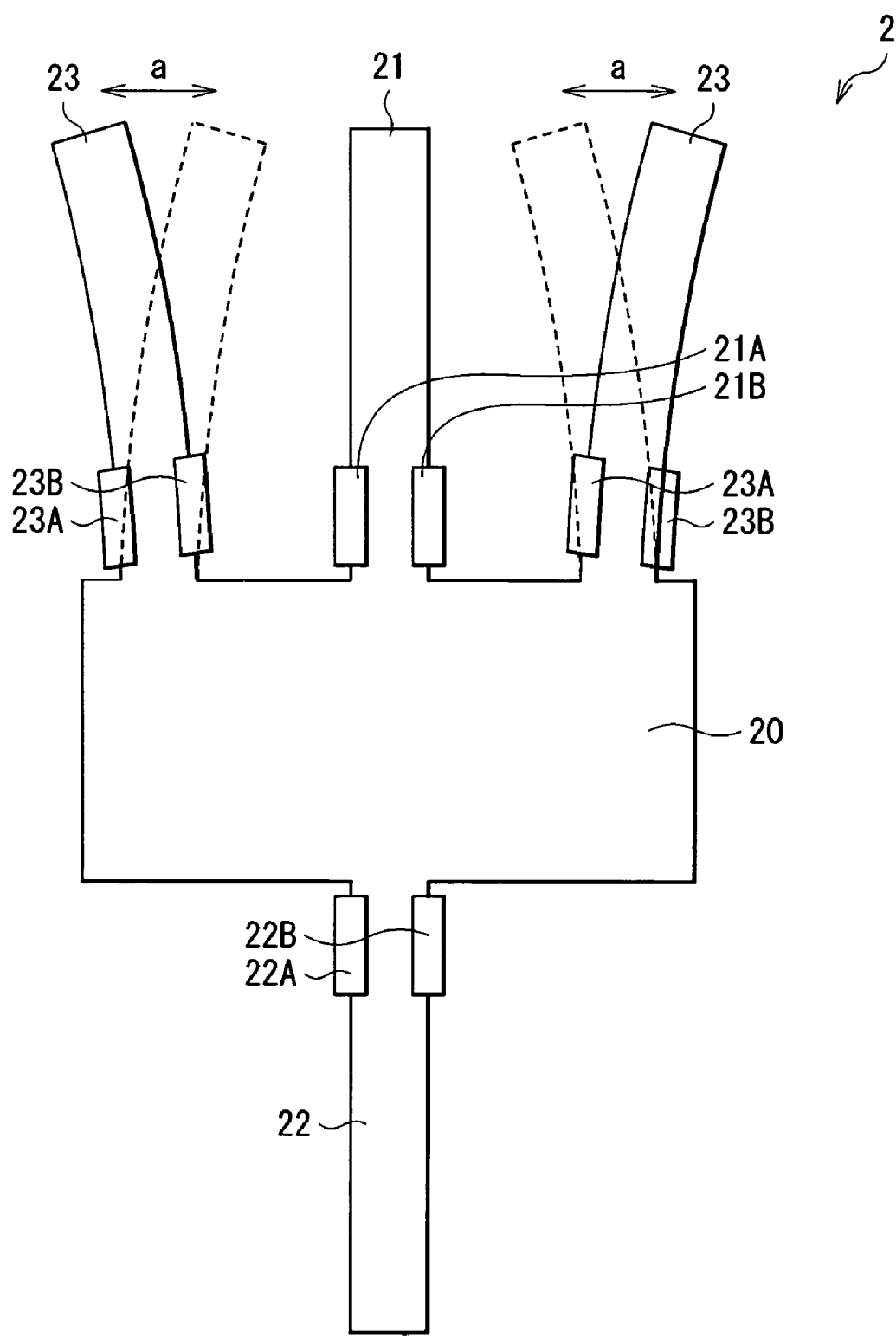
FIG. 16 is a top surface block diagram for explaining an operation of the angular velocity sensor of FIG. 1 when rotational motion is not applied thereto.

As for the angular velocity sensing device 1 with such configuration, when the pair of upper drive arms 23 are driven using the piezoelectric elements 23A and 23B at the time that an object equipped with the angular velocity sensing device 1 is not rotated, for example, the pair of upper drive arms 23 vibrate mostly in a direction "a" orthogonal to the extending direction of the upper drive arms 23, as shown in FIG. 16.

Figure 17:
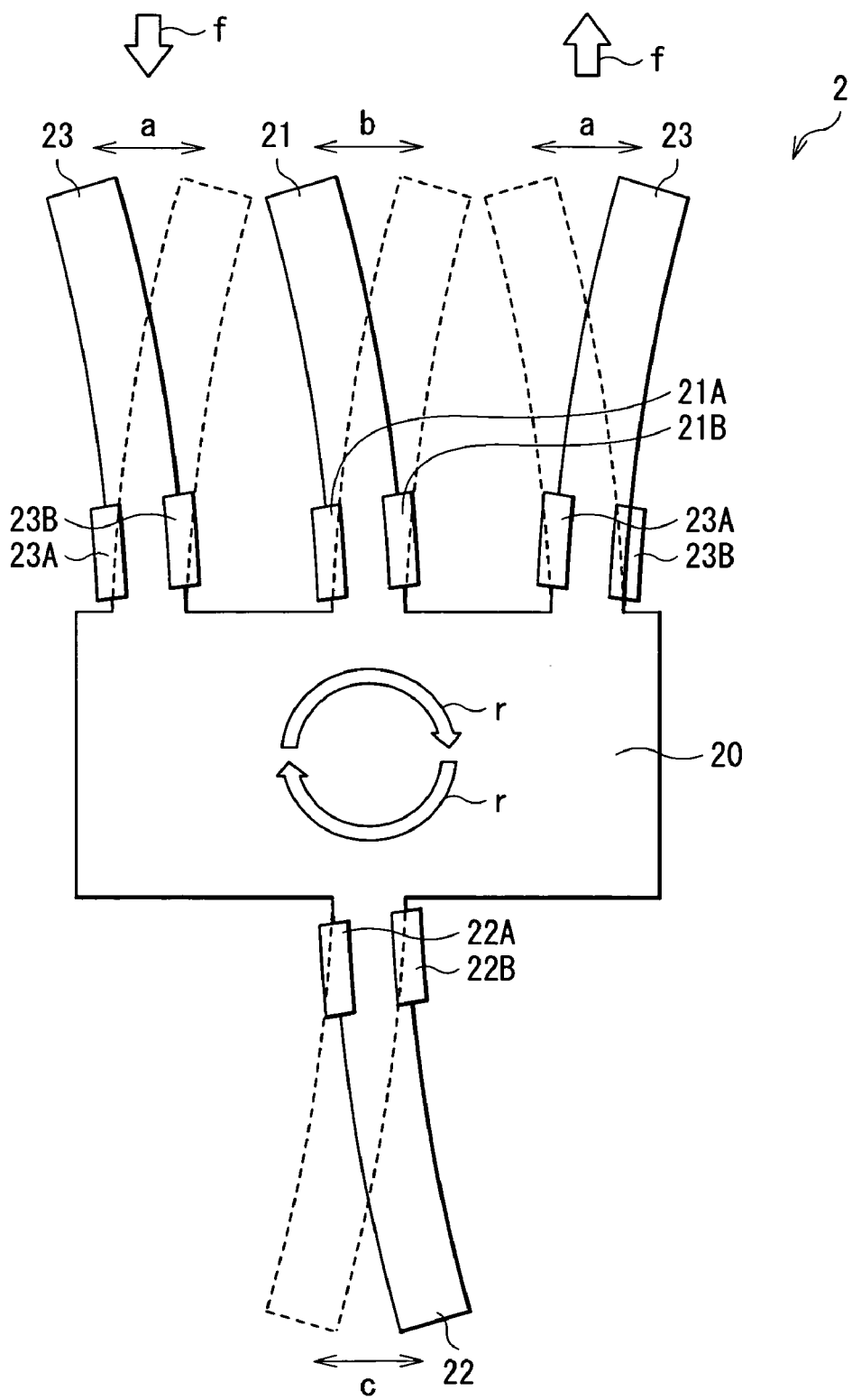
FIG. 17 is a top surface block diagram for explaining an operation of the angular velocity sensor of FIG. 1 when the rotational motion is applied thereto.

Then, when the object equipped with the angular velocity sensing device 1 starts a rotation "r" about a rotation axis extending in a direction vertical to the top surface of the sensor element supporting portion 51 for example, the Coriolis forces "f" act on the pair of upper drive arms 23 in a direction opposite to each other, and each of the upper detection arm 21 and the lower detection arm 22 starts an asymmetrical right and left vibration motion in a direction "b" orthogonal to the extending direction of the upper detection arm 21 and in a direction "c" orthogonal the extending direction of the lower detection arm 22 respectively, as shown in FIG. 17. Accordingly, a detection signal can be obtained from the piezoelectric elements 21A and 21B in accordance with the vibration of the upper detection arm 21 while a detection signal can be obtained from the piezoelectric elements 22A and 22B in accordance with the vibration of the lower detection arm 22, thereby detecting an angular velocity.

Figure 18:
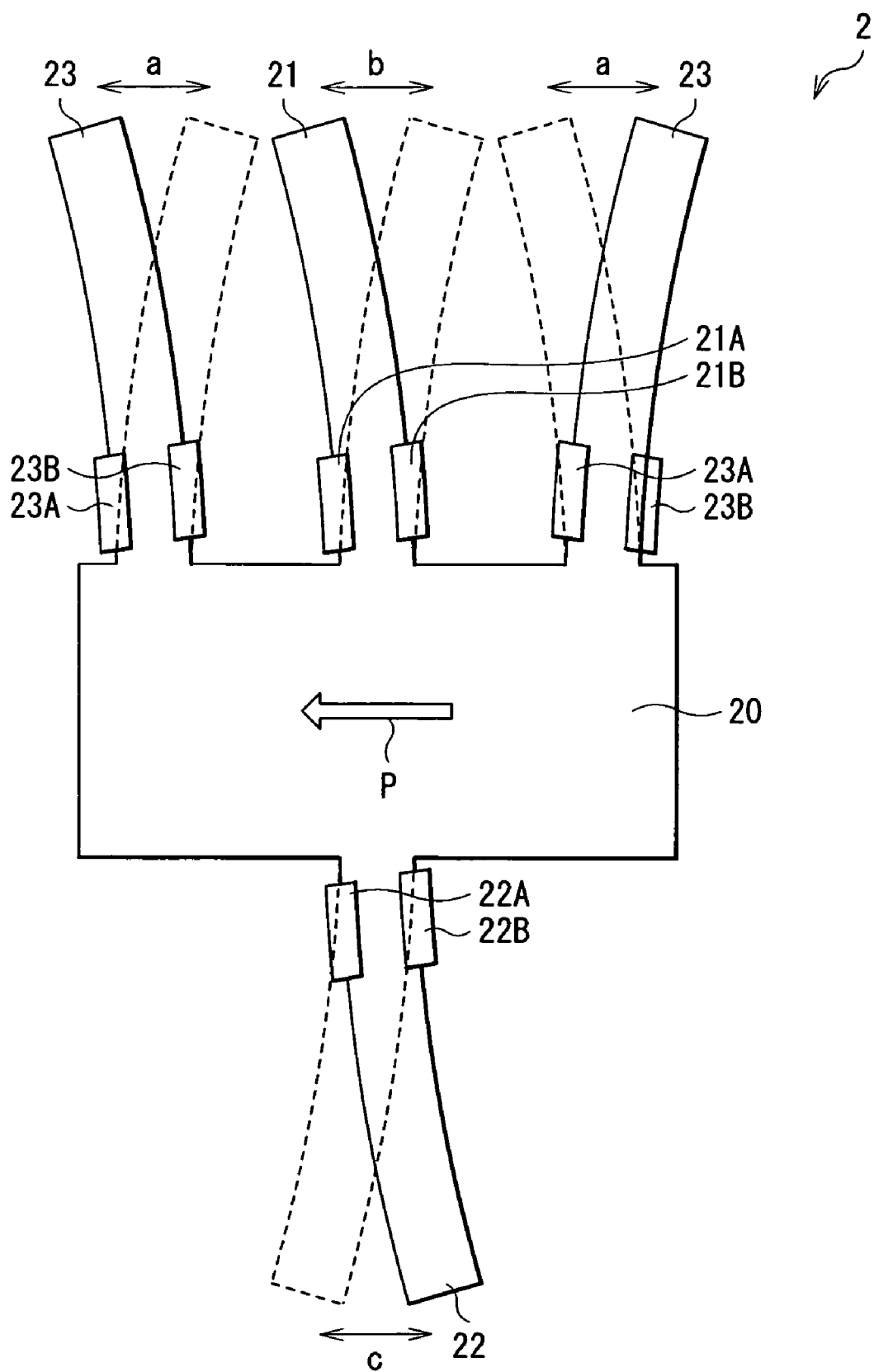
FIG. 18 is a top surface block diagram for explaining an operation of the angular velocity sensor of FIG. 1 when translational acceleration from a lateral direction is applied thereto.

By the way, since the lower detection arm 22 extends on a side opposite to that of the upper detection arm 21 and the pair of upper drive arms 23 according to the present embodiment, if a translational acceleration "p" is applied from a lateral direction as shown in FIG. 18 when the angular velocity is detected as mentioned above, or when the object equipped with the angular velocity sensing device 1 is stopped or rotates at the same speed, the upper detection arm 21 and the lower detection arm 22 are displaced in the same direction, thereby causing an in-phase vibration to both of them, in the direction "b" orthogonal to the extending direction of the upper detection arm 21 and in the direction "c" orthogonal to with the extending direction of the lower detection arm 22 respectively. Accordingly, output of vibration caused by the translational acceleration can be cancelled out by determining a difference in detection signals between the piezoelectric elements 21A and 21B and the piezoelectric elements 22A and 22B, to reduce a noise generation. Thus, the present embodiment can, even as a horizontally located type, discriminate the Coriolis-based vibration from the vibration caused by the translational acceleration, thereby becoming scarcely affected by the translational acceleration.

According to the present embodiment, as shown in FIGS. 4 to 10, the widths W11, W12 and W13 across the arrangement of the piezoelectric elements 21A to 21B, 22A to 22B, and 23A to 23B that are respectively disposed on the upper detection arm 21, the lower detection arm 22 and the pair of upper drive arm 23 are larger than the widths W1, W2 and W3 of the upper detection arm 21, the lower detection arm 22 and the pair of upper drive arms 23. That is, the piezoelectric elements 21A, 22A and 23A and the piezoelectric elements 21B, 22B and 23B partially protrude beyond the upper detection arm 21, the lower detection arm 22 and the pair of the upper drive arms 23 respectively. With this configuration, when the upper detection arm 21 and the lower detection arm 22 are bent due to the Coriolis force, the protruding portions of the piezoelectric elements 21A, 22A, 21B and 22B are more bent than the upper detection arm 21 and the lower detection arm 22. Thus the piezoelectric elements 21A, 22A, 21B and 22B can generate higher voltage than the case when the piezoelectric elements are arranged in such a manner that the width across the arrangement of the piezoelectric elements 21A and 21B is equal to the width of the upper detection arm 21 or the width across the arrangement of the piezoelectric elements 22A and 22B is equal to the width of the upper detection arm 21 or the lower detection arm 22. As a result, higher sensitivity is obtainable for the sensor elements.

In addition, when transmitting a driving signal to the piezoelectric elements 23A and 23B from the integrated circuit element 3, the upper drive arms 23 can be vibrated with less force or less electric power than the case when the width across the arrangement of the piezoelectric elements 23A and 23B disposed on the upper drive arm 23 is equal to the width of the upper drive arm 23.

When the pair of piezoelectric elements 23A and 23B are configured to extend symmetrically with respect to the centerline CL of the upper drive arm 23, symmetrical drive vibrations are generated more easily. As a result, the configuration of a drive circuit for driving the pair of upper drive arms 23 can be simplified and reduce the generation of unnecessary vibrations that would be generated in the upper detection arm 21 and the lower detection arm 22.

In addition, when the pair of piezoelectric elements 21A and 21B and the pair of piezoelectric elements 22A and 22B are configured to extend symmetrically with respect to a symmetry axis passing through center of the fixed portion 20 and extending in a direction orthogonal to the extending direction of the upper detection arm 21, the vibration caused by the translational acceleration can be easily discriminated from the angular-velocity-based vibration, thereby improving the detecting accuracy of the angular velocity.

Although the present invention has been described with reference to the above embodiments and modifications, the invention is not limited to the embodiments and so on but can be variously modified.

Figure 19:
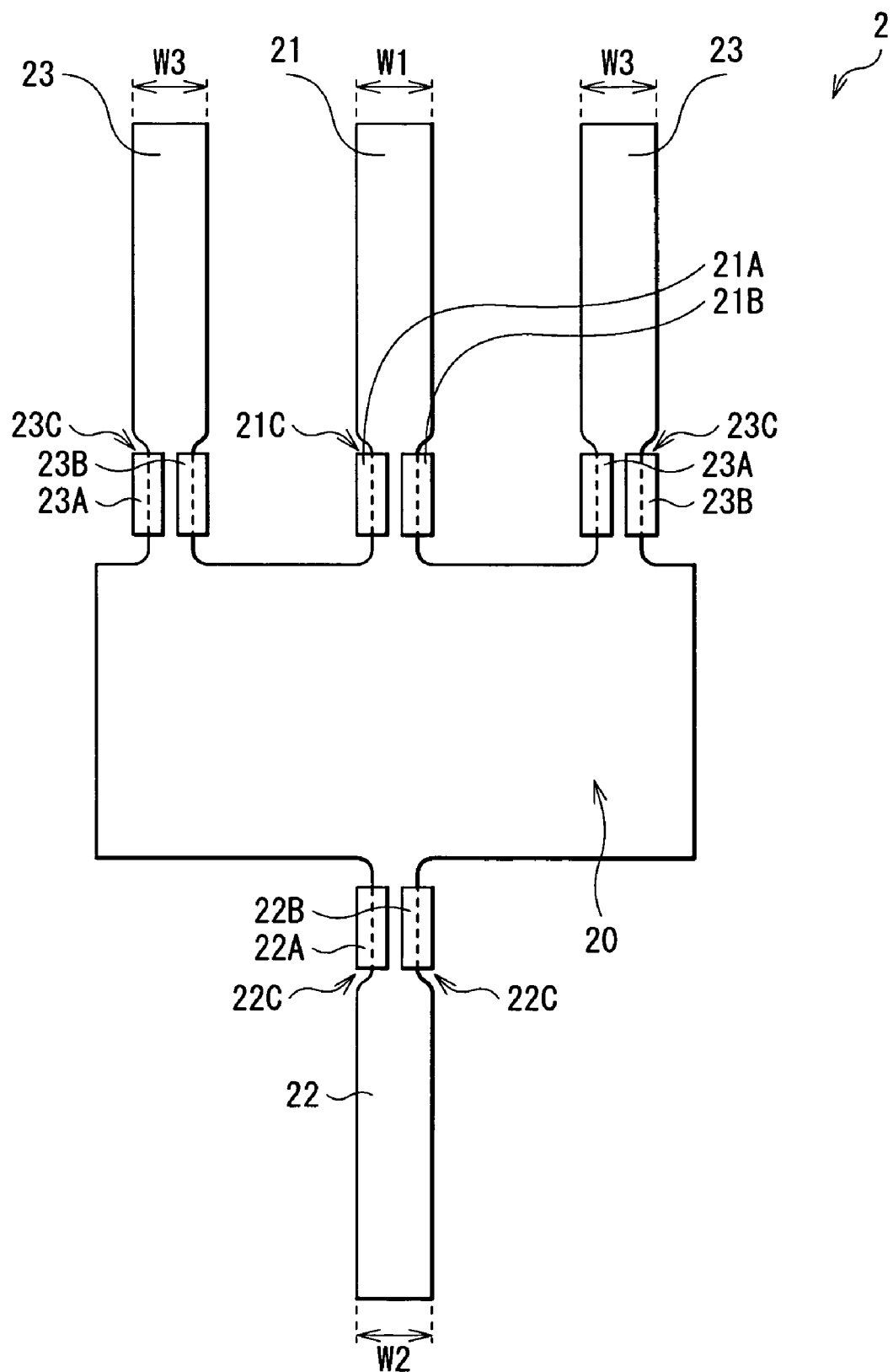
FIG. 19 is a top surface block diagram of an angular velocity sensor according to one modification of FIG. 1.

For example, according to the above-mentioned embodiments, the widths of the upper detection arm 21, the lower detection arm 22 and the pair of upper drive arms 23, as measured in the direction orthogonal to the extending directions thereof, are all constant anywhere along their extensions. However, as shown in FIG. 19, the upper detection arm 21, the lower detection arm 22 and the pair of upper drive arms 23 may have constrictions 21C, 22C and 23C that are narrowed in the direction orthogonal to the extending direction of the arms, around the portions opposed to the piezoelectric elements 21A and 21B, the piezoelectric elements 22A and 22B, and the piezoelectric elements 23A and 23B respectively. With this configuration, the piezoelectric elements 21A, 22A and 23A and the piezoelectric elements 21B, 22B and 23B can protrude beyond the upper detection arm 21, the lower detection arm 22 and the pair of upper drive arms 23 more easily even without enlarging the arrangement of the piezoelectric elements. Thus higher sensitivity is obtainable for the elements. In addition, the upper drive arms 23 can be vibrated with less force or less electric power than the case when the width across the arrangement of the piezoelectric elements 23A and 23B disposed on the upper drive arm 23 is equal to the width of the upper drive arm 23.

The width W1 of the upper detection arm 21, the width W2 of the lower detection arm 22, and the width W3 the upper drive arms 23 as measured in the directions orthogonal to the extending direction of the arms may be partially narrowed so that the width W11 across the arrangement of the piezoelectric elements 21A and 21B as measured in the direction orthogonal to the extending direction of the upper detection arm 21 may be larger than the width W1 of the upper detection arm 21 as measured for the narrowed portion in the direction orthogonal to the extending direction thereof, and the width W12 across the arrangement of the piezoelectric elements 22A and 22B as measured in the direction orthogonal to the extending direction of the lower detection arm 22 may be larger than the width W2 of the lower detection arm 22 as measured for the narrowed portion in the direction orthogonal to the extending direction thereof, and the width W13 across the arrangement of the piezoelectric elements 23A and 23B as measured in the direction orthogonal to the extending direction of the upper drive arm 23 may be larger than the width W3 of the upper drive arm 23 as measured for the narrowed portion in the direction orthogonal to the extending direction thereof. Thereby, higher sensitivity is obtainable for the piezoelectric elements 21A, 22A, 23A, 21B, 22B and 23B even without enlarging the arrangement of the piezoelectric elements. In addition, the upper drive arms 23 can be vibrated with less force or less electric power than the case when the width across the arrangement of the piezoelectric elements 23A and 23B disposed on the upper drive arm 23 is equal to the width of the upper drive arm 23.

In the above-mentioned embodiments, the case where the present invention is applied to an angular velocity sensor of what is called a horizontally located type is exclusively exemplified. However, it is also applicable to an angular velocity sensor of what is called a vertically located type.

Obviously many modifications and variations of the present invention are possible in the light of the above teachings. It is therefore to be understood that within the scope of the appended claims the invention may be practiced otherwise than as specifically described.

What is claimed is:

1. An angular velocity sensor comprising:
   a base portion extending in one direction, and
   a plurality of piezoelectric elements formed on the base portion and arranged along a width direction orthogonal to an extending direction of the base portion,
   wherein an arrangement width across an arrangement of the plurality of piezoelectric elements as measured in the width direction is larger than a width of the base portion.

2. The angular velocity sensor according to claim 1, wherein each of the piezoelectric elements includes a lower electrode, a piezoelectric layer, and an upper electrode layered in this order on the base portion, and in the arrangement of the plurality of piezoelectric elements, arrangement widths of at least the lower electrode and the piezoelectric layer, as measured in the width direction are larger than the width of the base portion.

3. The angular velocity sensor according to claim 1, wherein rest portions other than the upper electrode of each of the piezoelectric elements are formed integrally with each other.

4. The angular velocity sensor according to claim 1, wherein the piezoelectric elements are formed integrally with the base portion.

5. The angular velocity sensor according to claim 1, wherein the piezoelectric elements are stuck on the base portion.

6. The angular velocity sensor according to claim 1, wherein the piezoelectric elements are arranged symmetrically with respect to a centerline of the base portion.

7. The angular velocity sensor according to claim 1, wherein the base portion has a constriction narrowed in width, in a region where the piezoelectric elements are formed.

8. An angular velocity sensing device comprising an angular velocity sensor and an integrated circuit element, the angular velocity sensor including:
   a first base portion extending in a first direction, and
   a plurality of first piezoelectric elements formed on the first base portion and arranged along a width direction orthogonal to the first direction,
   wherein an arrangement width across a first arrangement of the plurality of first piezoelectric elements as measured in the width direction is larger than a width of the first base portion, and
   the integrated circuit element receives a detection signal outputted from the first piezoelectric elements.

9. The angular velocity sensing device according to claim 8, wherein
   the angular velocity sensor further including:
   a second base portion that are coupled to the first base portion directly or indirectly and extends in a second direction, and
   a plurality of second piezoelectric elements formed on the second base portion and arranged along a width direction orthogonal to the second direction,
   wherein an arrangement width across a second arrangement of the plurality of second piezoelectric elements as measured in the width direction is larger than a width of the second base portion, and
   the integrated circuit element transmits a driving signal to the plurality of second piezoelectric elements.

* * * * *